United States Patent
Riho et al.

(10) Patent No.: US 7,260,011 B2
(45) Date of Patent: Aug. 21, 2007

(54) SEMICONDUCTOR STORAGE DEVICE AND REFRESH CONTROL METHOD THEREFOR

(75) Inventors: Yoshiro Riho, Tokyo (JP); Yutaka Ito, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/640,388

(22) Filed: Dec. 18, 2006

(65) Prior Publication Data
US 2007/0097772 A1    May 3, 2007

Related U.S. Application Data

(62) Division of application No. 11/042,441, filed on Jan. 26, 2005, now Pat. No. 7,167,403.

(30) Foreign Application Priority Data
Jan. 30, 2004    (JP) ............................. 2004-024033

(51) Int. Cl.
    *G11C 7/00*    (2006.01)
(52) U.S. Cl. ................... 365/222; 365/189.07
(58) Field of Classification Search ............... 365/222, 365/189.07
    See application file for complete search history.

(56) References Cited

U.S. PATENT DOCUMENTS

| 5,596,545 | A * | 1/1997 | Lin ............................. 365/236 |
| 5,629,898 | A | 5/1997 | Idei et al. |
| 6,341,098 | B2 * | 1/2002 | Yamagata et al. .......... 365/226 |
| 6,697,992 | B2 | 2/2004 | Ito et al. |
| 6,735,726 | B2 | 5/2004 | Muranaka et al. |
| 6,795,362 | B2 | 9/2004 | Nakai et al. |
| 6,862,240 | B2 * | 3/2005 | Burgan ....................... 365/222 |
| 7,054,223 | B2 * | 5/2006 | Takahashi et al. .......... 365/233 |
| 7,136,320 | B2 * | 11/2006 | Schnabel et al. ........... 365/222 |
| 2005/0281112 | A1 | 12/2005 | Ito et al. |

FOREIGN PATENT DOCUMENTS

| JP | 1-116990 | 5/1989 |
| JP | 8-306184 | 11/1996 |
| JP | 2002-056671 A | 2/2002 |

* cited by examiner

*Primary Examiner*—Tuan T. Nguyen
(74) *Attorney, Agent, or Firm*—Foley & Lardner LLP

(57) ABSTRACT

A dynamic semiconductor storage device in which the power supply current during the standby time is diminished to decrease the power consumption and to suppress the chip area from increasing. During the normal operation, the information as to a word line associated with a row address accessed during the normal operation is stored in a RAM. In entering self refresh, data of memory cells connected to a word line associated with a row address accessed during the normal operation time is read out and check bits for the data are appended in an encoder and written in a check bit area. As an initializing operation for the first self refresh entry after power up sequence, the data retention time of the memory cells is inspected every word line. Based on the results of inspection, the setting value of the refresh period of the word line is determined and written in the RAM to set the word line based refresh period. During error check for the refresh operation, any error is corrected by an error correction circuit.

38 Claims, 23 Drawing Sheets

FIG. 18

|  |  | COMP. EX. | EX. |
|---|---|---|---|
| CHIP SIZE | | +3.7% | +7.2% |
| ICC6 | | 60uA | 50uA |
| ENTRY TIME | | 400ms | 200ms |
| ENTRY CURRENT | | 60mA | 60mA |
| FIRST ENTRY | | 400ms | 64s |
| FIRST ENTRY CURRENT | | 60mA | 560uA |
| EXIT TIME DESIGN PARAMETER CHANGE ELEMENT | | 400ms (AS ACTUALLY MEASURED) | 6.5ms |
| EXIT CURRENT | | 60mA (AS ACTUALLY MEASURED) | 60mA |
| FOR MOBILE PHONE | | POSSIBLE | POSSIBLE |
| POWER OFF | | POSSIBLE | NOT POSSIBLE |
| NOTE | NUMBER OF TIMES OF ENTRY/EXIT OPERATION | ENTRY: ENCODE PRODUCT CODE ; READ ALL BITS TWICE  EXIT: DECODE PRODUCT CODE ; READ ALL BITS TWICE | ENTRY: ENCODE HAMMING CODE ; READ ALL BITS ONCE  EXIT: BURST REFRESH ALL BITS ONCE  DECODE REFRESH TIME VARIATION BITS(500BITS) READ 256 BITS ONCE |
| | FIRST ENTRY AS FROM POWER ON | SAME AS NORMAL ENTRY | INITIALIZE FOUR-VALUED ADAPTIVE REFRESH READ ALL BITS THRICE |

SEMICONDUCTOR STORAGE DEVICE AND REFRESH CONTROL METHOD THEREFOR

CROSS-REFERENCE TO RELATED PATENT APPLICATIONS

This application is a division of application Ser. No. 11/042,441, filed Jan. 26, 2005, now U.S. Pat. No. 7,167,403, which claims priority from Japanese Patent Application No. 2004-024033, filed Jan. 30, 2004, by Yoshiro Riho and Yutaka Ito, both of which are incorporated herein by reference in their entirety. This application claims only subject matter disclosed in the parent application and therefore presents no new matter.

FIELD OF THE INVENTION

This invention relates to a semiconductor storage device and, more particularly, to a dynamic semiconductor storage device having memory cells that are in need of refreshing for data retention, and a refreshing controlling method therefor.

BACKGROUND OF THE INVENTION

For reducing current consumption in a dynamic random access memory (DRAM) during the standby time when only data retention is made, it is indispensable to reduce the current during the refresh operation (the operation of amplifying data read out to a bit line from memory cells connected to the word line associated with the refresh address, and of re-storing the read-out data via the bit line).

In the DRAM, where the storage capacity is becoming larger and larger and the miniaturization is advancing, attempts are being made to improve the worst case value of the data retention time of the memory cell by the fabrication process. By way of circuit designing countermeasures, such a technique consisting in providing 100 or more remedy sets, employing redundant cells, per one bank (e.g. 64 megabits) in order to eke out shortage of the retention time for certain memory cells, or such a technique consisting in remedying with anti-fuses in order to provide for substitution to redundant cells even after package assembling of the REAM device, has been developed. However, in case the retention time is increased through 200 ms or 300 ms to approaches to a limit, retention failure, termed retention time variation failure, tends to be produced due to unforeseen noises, including software errors. Hence, it is necessary to cope with such failure by a technique other than the above techniques.

Also, from the perspective of costs of the DRAM device, it is necessary to suppress the chip size penalty (that is, circuit increment for providing the retention time).

For a user, it is also necessary not to change the specifications of the DRAM device (interface) from those of a conventional product, that is, to maintain interchangeability with the conventional product, at the time of entry to or exiting from the standby time mode (self refresh). For application to a customer frequently repeating the entry to and exiting from the standby mode (self-refresh), such as a mobile phone terminal, it is necessary to reduce the operating current at the time of entry to or exiting from the standby time mode (self refresh).

As refresh control for the dynamic RAM (DRAM), there is disclosed in the Patent Publication 1, indicated hereinbelow, a configuration in which power consumption may be appreciably reduced by carrying out refreshing with two or more refresh periods associated with information retention time for the memory cells, in terms of plural word lines, to which is allocated a common refresh address, as a unit. In this technique, only certain memory cells where the retention time is in shortage are refreshed with a short period, e.g. of the order of 100 ms, while the remaining memory cells are refreshed with a longer period, e.g. of the order of 1 s, thereby reducing the standby current of the DRAM. The refresh period is sorted during wafer inspection every main word line (MWL) and the result of the sorting, that is, the short period or the long period, is recorded in a PROM enclosed in the DRAM. It is noted that a PROM array forms an adaptive refresh controller. When entry is made to self refresh, the totality of the main word lines are refreshed with the long period and, after time T, the refresh operation with the long term is repeated. Exiting from the self refresh is with 'self refresh exit'.

The flowchart of FIG. 22, prepared by the present inventor, illustrates the adaptive refresh control described in the Patent Publication 1. On entry to the self refresh (step S601), the totality of main word lines is refreshed with the long period T (step S602). The main word line, registered in the PROM with the short refresh period (T/N), then is refreshed with a short period (T/N) (step S603). Except in case of exiting from self refresh (NO branching in a step S604), refresh with a short period (T/N) is repeated N times (steps S604, S605). After time T, refresh with the long period is repeated (steps S605 and S606). In case of exiting from self refresh in the steps S604, S606, processing transfers to the self refresh exit processing of a step S607.

There is also disclosed in e.g. the Patent Publication 2, indicated hereinbelow, a technique in which, at the time of entry to an operating mode carrying out only the data retention operation, the totality of bits are encoded (check bits are generated and stored), using an ECC (error correcting circuit), the refresh operation is carried out as the refresh period is elongated within the allowance range of error generation by the error correcting operation employing the check bit and, in returning (exiting) from the data retention mode to the normal operation, the error correcting operation is carried out using the data and the check bits by the ECC circuit, to carry out refresh with a period not shorter than the retention time of the memory cell. With the Patent Publication 2, the entire area in the chip is refreshed with the long period, such as about 1 s, to reduce the standby current of the DRAM. FIG. 23, prepared by the present inventors, illustrates the refresh control during standby time of the Patent Publication 2.

In entry to the low power consumption (SSR) mode, the totality of bits is encoded (steps S701, S702) and the correction operation is carried out by decoding the totality of bits at the time of exiting (steps S705, S706).

[Patent Publication 1]
JP Patent Publication Kokai JP-A-08-306184 (pages 4, 5 and FIG. 1)

JP Patent Publication Kokai JP-A-2002-56671 (page 3 and FIG. 1)

SUMMARY OF THE DISCLOSURE

Meanwhile, the results of the investigation, conducted by the present inventors, have indicated that the adaptive refresh, described e.g. in the above Patent Publication 1, suffers from the following problems:

(A) It is assumed that the refresh period for a 256 Mbit DRAM is sorted at an elevated temperature (for example, at T=85° C., in terms of 32 Kbits for a main word line, with a long period (such as 1 s) and with a short period (such as 100 ms). In this case, with 20000 bit memory cells, with the retention time not longer than 1 s, the main word line (MWL) in need of refresh with the short period (100 ms) is increased to e.g. one bank (64 Mbits). Hence, the efficacy of reducing the standby current is not larger than three fourths.

(B) If the refresh period is sorted with the wafer test (test on a wafer prober), sorting failure occurs if retention time variations occur in a process following the package assembling.

(C) In addition, at an elevated temperature of T=85° C., it may be an occurrence that the retention time is decreased to as low as 200 ms. However, if the refresh is carried out frequently, the efficacy in reducing the standby current may not be improved.

On the other hand, the results of the scrutiny, conducted by the present inventors, have indicated that the refresh control during standby with the above Patent Publication 2 suffers from the following problems:

(A) Referring to FIG. 23, the totality of bits is encoded at the time of entry to the low power consumption mode (also termed Super Self Refresh (SSR)) and the operation of error correction by decoding the totality of bits is carried out in exiting (step S705). The result is the increased current consumption in case the user repeats entry and exiting.

(B) For the period for error correction (such as step S705 of FIG. 23), it is necessary to set the time duration for prohibiting a command from outside from being accepted. This time duration, as the exiting time, may e.g. be on the order of 400 ms. Hence, the specifications different from those for conventional self refresh need to be set in the manner of exiting from the low power consumption mode.

Accordingly, it is an object of the present invention to provide a semiconductor storage device in which low power consumption at the standby time is achieved and in which the chip area is prohibited from being increased.

For accomplishing the above object, the following is substantially the configuration of the invention disclosed in the present application.

In one aspect, the present invention provides a semiconductor storage device comprising a memory array, including a plurality of memory cells, arranged in an array, the memory cells being arranged at points of intersection between a plurality of bit lines and a plurality of word lines, the memory cells being in need of refresh for retention of data, a storage circuit for storage of a setting value of a refresh period, from among a plurality of preset refresh periods, which is associated with each word line, and a circuit for managing control for inspecting data retention time in the memory cells, at the time of entry to a preset self refresh mode following power up sequence, in terms of the word line as a unit, and for determining the setting value of the refresh period, in terms of the word line as a unit, based on the result of the inspection, to record the setting value thus determined in the storage circuit.

In another aspect, the present invention provides a storage circuit for recording the information as to the word line associated with the row address accessed during the normal mode, and an encoding circuit for appending, at the time of entry to a preset self refresh mode following power up sequence, prior to entry to the self refresh mode, check bit information for data of the memory cells connected to the word line associated with the row address accessed during the operation in the normal mode prior to the time of the entry to the self refresh mode, and for writing the so generated check bit information in a check bit area added to the memory array.

The semiconductor storage device further includes a detection circuit for detecting the failure of a memory cell in the self refresh, a correction circuit for correcting data of the memory cell where an error has been detected, and a circuit for managing control for changing the setting value of the refresh period of the word line, to which is connected the memory cell, where an error has been detected, to record the so changed setting value in the storage circuit.

In a further aspect, the present invention provides a semiconductor storage device further comprising a self refresh control circuit including a circuit for generating a refresh address, and a circuit for generating a refresh period, in which the refresh period generating circuit variably controls the length of the refresh period in refreshing with the preset refresh period, based on the results of error detection in the error detection circuit. For example, the length (time) of the period is shortened or lengthened for sorts of the refresh period, namely a long period and a short period.

In a further aspect, the present invention provides a refresh controlling method for a semiconductor storage device having a memory array including a plurality of memory cells, arranged in an array, the memory cells being arranged at points of intersection between a plurality of bit lines and a plurality of word lines, with the memory cells being in need of refresh for retention of data. The method comprises a step of storing, in a storage circuit, a word line associated with a row address accessed during the operation in the normal mode, a step of managing control for reading out data of a memory cell connected to a word line associated with the row address accessed during the operating period with the normal mode at the time of entry from the normal mode prior to the self refresh, and generating check bit information for the data to write the check bit information in an inspection area provided in the memory cell array, and a step of inspecting the data retention time in the memory cells, as an initializing processing to an entry to a self refresh mode following power up sequence, every word line, determining a setting value of the refresh period of the word line based on the results of inspection, and writing the setting value in a storage circuit.

In the above method of the present invention, the memory array may include at least one dummy cell for a plurality of memory cells for data storage connected to the same bit line, with the dummy cell being connected to the same bit line. The method may comprise the steps of copying data of a memory cell, connected to a word line, as a subject of refresh period inspection, in the dummy cell, in selecting the word-line based refresh period, inspecting whether or not an error is detected in a memory cell for the word line, with a plurality of preset refresh periods, to select the refresh periods, and returning the data copied in the dummy cell to the memory cell after end of the setting of the refresh period on the word line.

The method of the present invention may further comprise the steps of refreshing with a refresh period during said self refresh operation, and correcting an error in case one has been detected in data of a memory cell by the refresh, and setting the refresh period of the word line to a refresh period shorter than the one refresh period.

In the method of the present invention, refreshing the memory array may be made in a burst mode, and an error in data of a cell detected may be corrected and written in exiting from the self refresh mode to the normal mode.

In a further aspect, the present invention provides a method for copying data for a semiconductor storage device having a memory array including a plurality of memory cells, arranged in an array, the memory cells including a plurality of bit lines, a plurality of word lines, and a plurality of memory cells arranged at points of intersection between the bit lines and the word lines, the memory cells being in need of refresh for retention of data. The method comprises the steps of activating one of the word lines as a copying source, amplifying retention data of a memory cell connected to the one word line by a sense amplifier connected to a bit line to which the memory cell is connected, activating one of the word lines as a copying source and re-storing data amplified by the sense amplifier in the memory cell connected to one or plural word lines as the copying destination. The retention data of the memory cell connected to the one word line is copied to the memory cell connected to the word line as the copying destination.

The meritorious effects of the present invention are summarized as follows.

According to the present invention, the power supply current at the standby time may be reduced to lower the power consumption.

According to the present invention, only cell data of a row address, accessed during the normal operation, is selectively encoded, thereby realizing low power consumption.

According to the present invention, optimum refresh may be variably set, from one word line to another, after power on, thereby enabling adaptive refresh following product shipment.

According to the present invention, the chip area may be prevented from increasing by providing an ECC circuit per bank.

According to the present invention, the chip area may further be prevented from increasing by providing an error detection circuit of a simpler structure on a bit line between the memory cell array and the sense amplifier.

Moreover, according to the present invention, the refresh period is dynamically variably controlled on the basis of the results of error detection during the refresh operation to correct the refresh period optimally accurately responsive to the operating (ambient) device temperature.

[Best Mode for Carrying Out the Invention]

The principle and embodiments of the present invention are explained with reference to the drawings.

In the semiconductor storage device of the present invention, the word line associated with the row address accessed during the normal operation following power on is stored in a storage circuit (step S101 of FIG. 1). During entry to the refresh mode (step S102 of FIG. 1), data of the memory cell connected to the word line for the row address accessed during the normal operation prior to the self refresh is encoded (step S103 of FIG. 1).

As an initializing operation at the time of the first entry to the refresh mode following power on, the refresh period is selected on the word line basis.

During the refresh operation after initialization of the self refresh mode, refresh of the word line, set to the short period T/N (sub-word line) is carried out N times, after which the memory cell is refreshed with the long period T.

Refresh is carried out with the long refresh period (step S105 of FIG. 1). If data error is found in the memory cell by this refresh (step S106 of FIG. 1), the error is corrected (step S107 of FIG. 1). The refresh period of the word line is set to a shorter period (step S108 of FIG. 1). In exiting from the self refresh mode to the normal mode (YES branching of steps S110 and S112), refresh is carried out in the burst mode for the bank and the error of data of the cell where the error is detected is corrected and written (step S113).

According to the present invention, at least one dummy cell is provided for a plurality of memory cells for data storage connected to the same bit line, with the dummy cell being connected to the same bit line. The method comprises the steps of copying data of a memory cell, connected to a word line, as a subject of refresh period inspection, in the dummy cell, in selecting the word-line based refresh period, inspecting whether or not an error is detected in a memory cell for the word line, with a plurality of preset refresh periods, to select the refresh periods, and returning the data copied in the dummy cell to said memory cell after end of the setting of the refresh period on the word line.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 18 illustrates the four-value adaptive refresh of the second embodiment of the present invention and a Comparative Example.

PREFERRED EMBODIMENTS OF THE INVENTION

Figure 1:
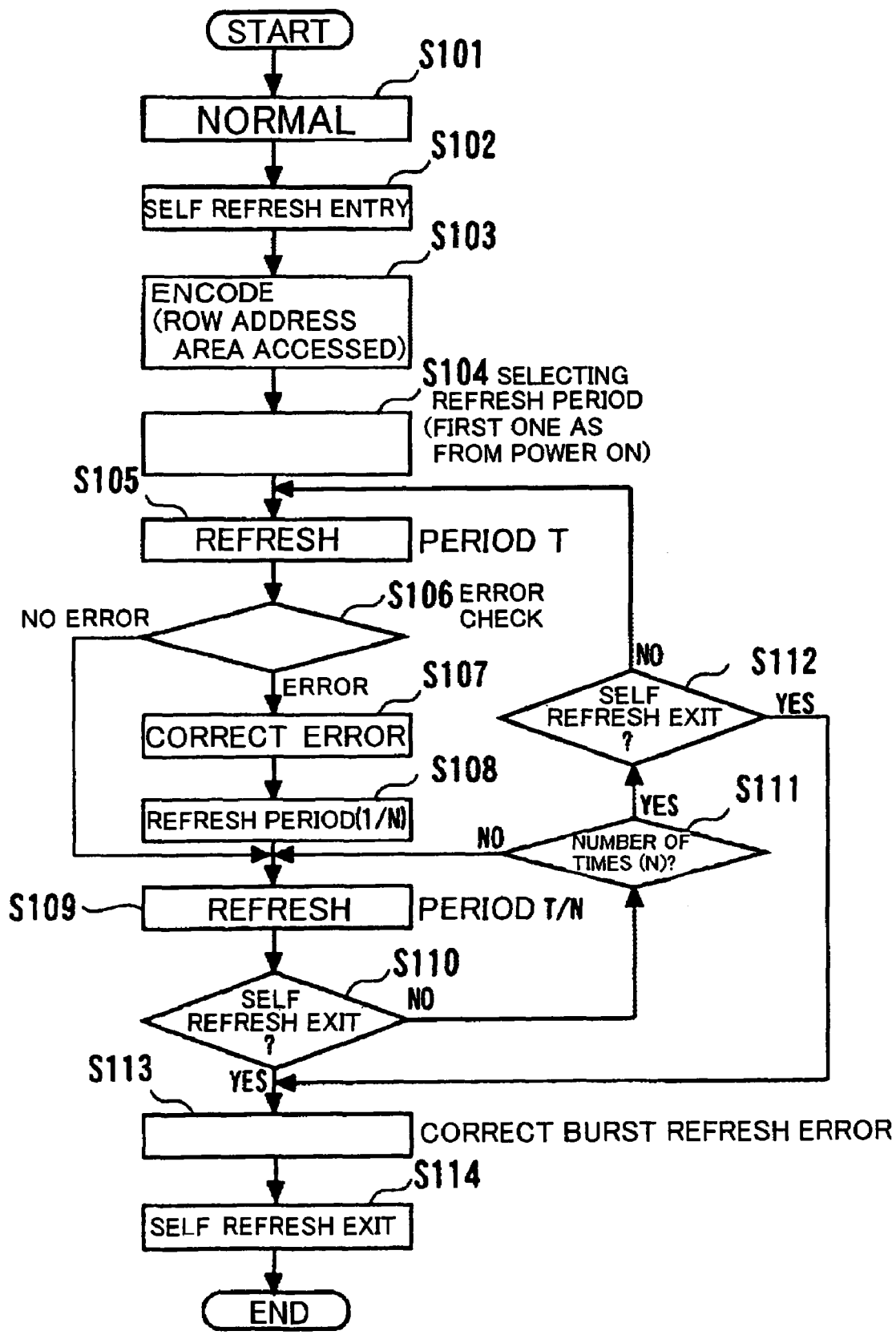
FIG. 1 is a flowchart for illustrating the operation of a semiconductor storage device according to a first embodiment of the present invention.

FIG. 1 illustrates a refresh controlling method according to an embodiment of the present invention. Referring to FIG. 1, the refresh control method according to a first embodiment of the present invention is explained. During the normal operation (normal operation mode) of a step S101, the row address accessed is recorded in a storage unit. In self refresh entry of the next step S102, only cell data of the row address area accessed during the normal operation mode is encoded (a check bit by an ECC circuit is generated and stored) (step S103). By limiting the address area for encoding, the current consumption needed in the entry operation to self refresh is decreased. This configuration is one of the main features of the present invention.

In a step S104, in which the self refresh mode has been entered, the refresh period is selected from one word line to another. That is, the refresh period is selected, preferably at the time of first self refresh entry following power up of the DRAM device. At the time of first self refresh entry following power up, one of a predetermined plural (for example, bi-valued or four-valued) refresh periods is set, in terms of a sub-word line (SWL) of the memory array as a unit, in order to achieve adaptive refresh to reduce the standby current. This configuration is another of the main features of the present invention.

In the next step S105, the refresh operation is carried out with a long period T.

In the next step S106, it is checked whether or not there is any error in cell data by refresh with the long period T. If there is any error, such error is corrected in a step S107. In the next step S108, the refresh period of the memory cell of the sub-word line in question is updated to a short period (such as 1/N of T).

If exit from the self refresh is not commanded (NO branch of a step S110), the refresh with the short period is repeated N times (loop of steps S110, S111 and S109). If, after lapse of time T, exit from the self refresh is not commanded (N branch of step S112), processing transfers to a step S105 to carry out refresh with a long term T.

In exiting from self refresh, refresh and error correction are carried out with a burst mode of the memory array (bank) (step S113). If the number of word lines of a bank is 8K, burst refresh and error correction are carried out for such 8K. By this, transition from self refresh to the normal mode occurs after correcting data held in the memory cell in case of error occurrence during the self refresh mode (step S114).

In the aforementioned step S113, the cell data read out to a bit line by refresh is processed with error detection and correction, using an ECC circuit. The refresh period for a sub-word line connected to the memory cell where error correction has occurred is changed to a short period. The configuration of carrying out burst refresh and error correction in exiting from the self refresh is still another of the main features of the present invention.

According to the present invention, the market reject ratio may be suppressed to not larger than 200 ppm by the above refresh control. Although the explanation with reference to FIG. 1 is based on a bi-valued configuration comprising a long period (T) and a short period (T/N), as refresh periods, similar control may be exercised for a number of the refresh periods larger than bi-level numbers, such as four-level numbers.

Moreover, in the present embodiment, the chip size of the DRAM device may be prohibited from being increased by the following technique:

The chip area may be prohibited from increasing by recording the refresh period for each sub-word line (SWL). In the present embodiment, the refresh period may be individually set in terms of plural sub-word lines, associated with a main word line, as a unit.

The chip area may be prohibited from increasing by recording the information on the row address accessed during the normal operation.

Figure 2:
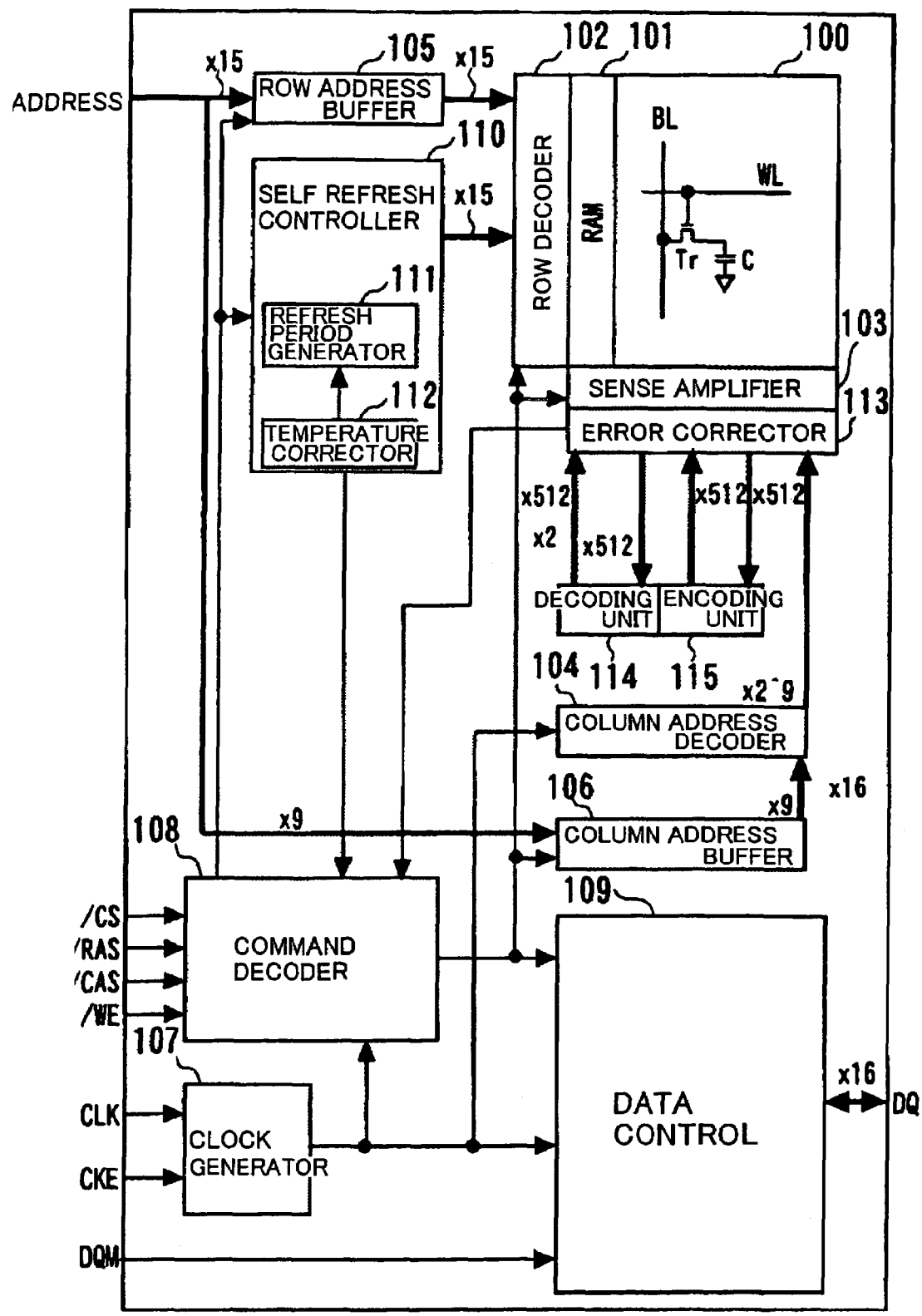
FIG. 2 is a diagram showing the configuration of the semiconductor storage device according to the first embodiment of the present invention.

FIG. 2 is a diagram showing the configuration of a semiconductor storage device, according to an embodiment of the present invention, in which the present invention has been applied to a clock synchronization DRAM. Referring to FIG. 2, the semiconductor storage device according to the present embodiment includes a bank 100, formed by a memory array, having a memory cell (transistor Tr and a capacitor C) at a point of intersection of a bit line BL and a word line WL, a RAM (random access memory) 101, as a storage unit for the row address access information and the refresh period information, a row decoder 102, for decoding the row address (15 bits in the example shown in FIG. 2), including a word driver for driving the selected word line, and a sense amplifier 103 connected to the RAM 101 and to a bit line of the memory array 100. The memory array 100 also includes a row address buffer 105, supplied with a row address, a column address buffer 106, supplied with a column address (9 bits in the example shown in FIG. 2), a column address decoder 104, a clock generator 107, a command decoder 108, a self refresh controller 110 and a data control circuit 109. The semiconductor storage device of the present embodiment also includes an error detector 113, provided in association with the sense amplifier 103 of the memory array and a decoder 114 and an encoder 115 provided common to plural memory arrays making up a bank. That is, in the example shown in FIG. 2, one set of the decoder 114 and the encoder 115 is provided per bank, whilst one error detector 113 is provided per memory array. The semiconductor storage device of the present embodiment also includes an address counter, not shown. The self refresh controller 110, generating a refresh address to output the so generated refresh address to the row decoder 102, includes a refresh period generator (refresh timer) 111, and a temperature corrector 112 for variably controlling the refresh period based on a temperature characteristic. The row decoder 102 includes a multiplexer, not shown, for selecting a refresh address (15 bits) from the self refresh controller 110 during the refresh operation, and for selecting a row address output (15 bits) from the row address buffer 105 otherwise.

The control signals, entered to the control terminal, are a chip select signal/CS, a row address strobe signal/RAS, a column address strobe signal/CAS, and a write enable signal/WE. A signal DQM is a control signal for controlling data input/output. The signal CLK is a clock signal for synchronization. The CKE is a clock enable signal and, if CKE is at a high level, the rising edge of the next clock signal is valid. If CKE is at a low level, the rising edge is invalid and standby state is set at the low level. The DQM is a signal for masking input/output data DQ and, if the DQM terminal is at a high level, an output buffer, not shown, is in a state of high impedance. The data control circuit 109 controls the inputting of write data from a DQ terminal (16 bits in the example shown) and the outputting of readout data from the cell array, by the command decoder 108, based on the results of decoding of the read/write command, DQM signal and on the inner clock signal.

The RAM 101 stores the access information of a row address accessed during the normal operation, in association with each row address, while holding the refresh type information in association with the row address. The RAM 101 is selected by a selected word line of the row decoder 102. That is, the RAM 101 is selected by the same row address as the access address.

In the example shown in FIG. 2, the number of word lines of a memory array is e.g. $2^{15}$=8K, while the column address is $2^9$=512=0.5K, with the number of outputs of the sense amplifier 103 being 512. Each bank has a capacity of 4K×16=64M bits, with the data being of 16 bits. That is, each bank has a capacity of 4K×16=64M bits, with the semiconductor storage device being formed by four banks to constitute a 256 Mbit DRAM. In FIG. 2, only a 1-bank memory cell array is shown for simplicity.

In the present embodiment, a cyclic code is used for the error correction circuit (ECC circuit), mounted on the same chip as that of the DRAM. A set of an encoder 115 and a decoder 114, making up the ECC circuit, is provided to each bank. The error detector 113 is provided one per memory cell array. In the present embodiment, the error detector 113 is connected to the bit line across the sense amplifier 103 and the memory cell array, as explained subsequently. However, the error detector is shown connected to the sense amplifier 103 for simplicity. In the example shown in FIG. 2, an error detection signal (check bit line) from the error detector 113 is coupled to the command decoder 108, which command decoder 108 performs a read operation on error detection by the error detector 113 to permit the decoder 114 to correct the error.

Figure 3:
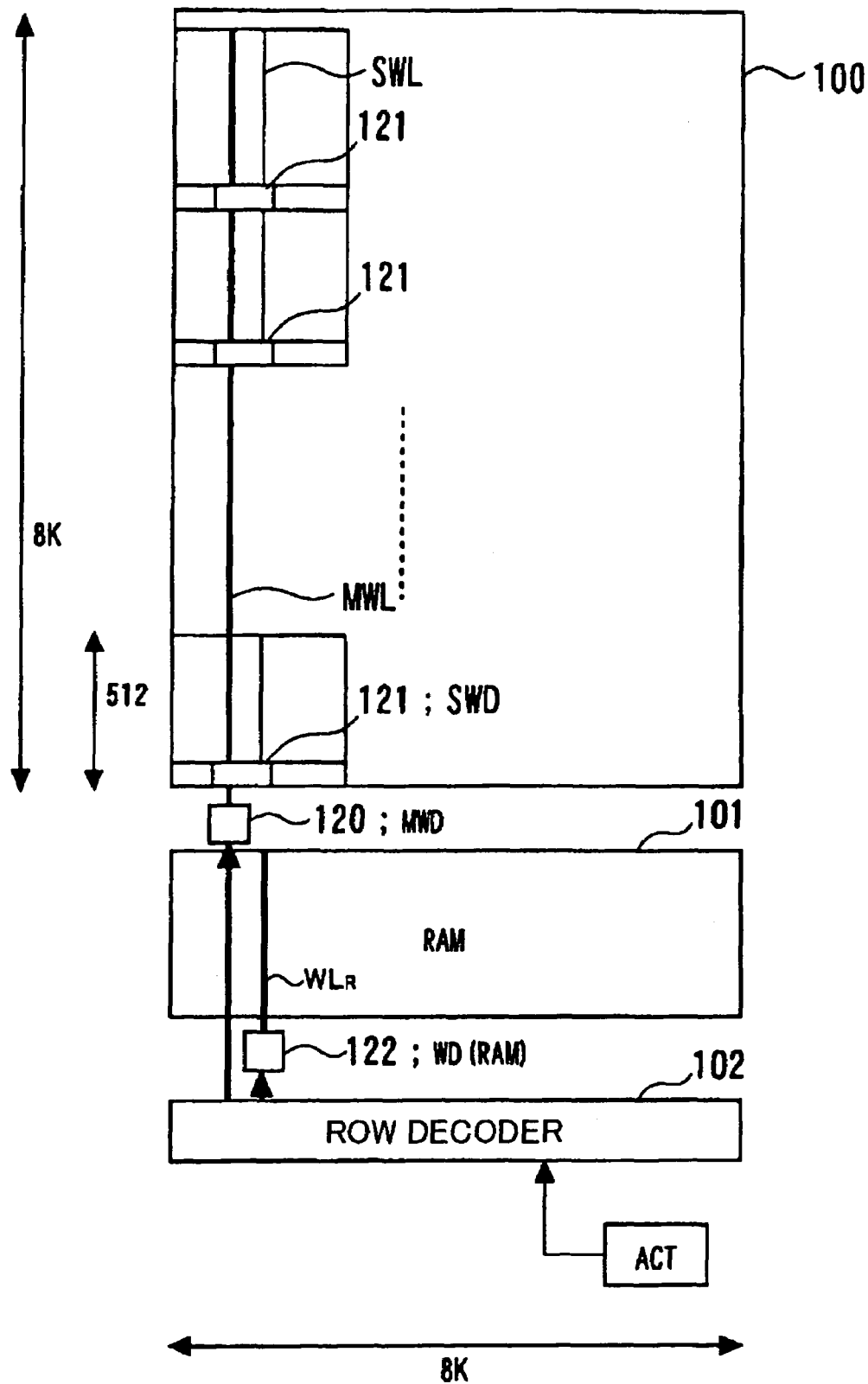
FIG. 3 illustrates the recording of a row address in a RAM according to the first embodiment of the present invention.

FIG. 3 is a schematic view showing the operation of the semiconductor storage device of the present embodiment shown in FIG. 2, and schematically illustrates the operation and the configuration of the address recording during normal accessing. Meanwhile, the number of word lines per bank (memory array) is 8K (8096), the number of bit line pairs, not shown, per one memory array of the bank 100, is 512 pairs, the number of memory arrays for the bank 100 is 16 (16×512=8K), the memory capacity per one bank is 64 Kbits and the 8K word lines of the memory array is sub-divided into 32 sub-arrays in terms of e.g. 256 word lines as a unit.

The row decoder 102 is activated by an active command (ACT; bank active command) from the command decoder 108, and decodes the input row address. A main word driver (MWD) 120, associated with the word line, as selected by the row decoder 102, drives a main word line MWL. Each sub-word driver (SWD) 121, provided every 16 memory arrays, and which is connected to the main word line (MWL), activates the associated sub-word line (SWL). It is noted that the memory cell array is associated with 512 column address signals and includes 16×512=8K column address signals per bank. A word driver (WD) 122, associated with the selected main word line MWL, activates the word line $WL_R$ of the RAM 101 to write in the row address in question the fact that an access event has occurred. For example, data "1" is written in a memory cell of the selected word line $WL_R$.

Figure 4:
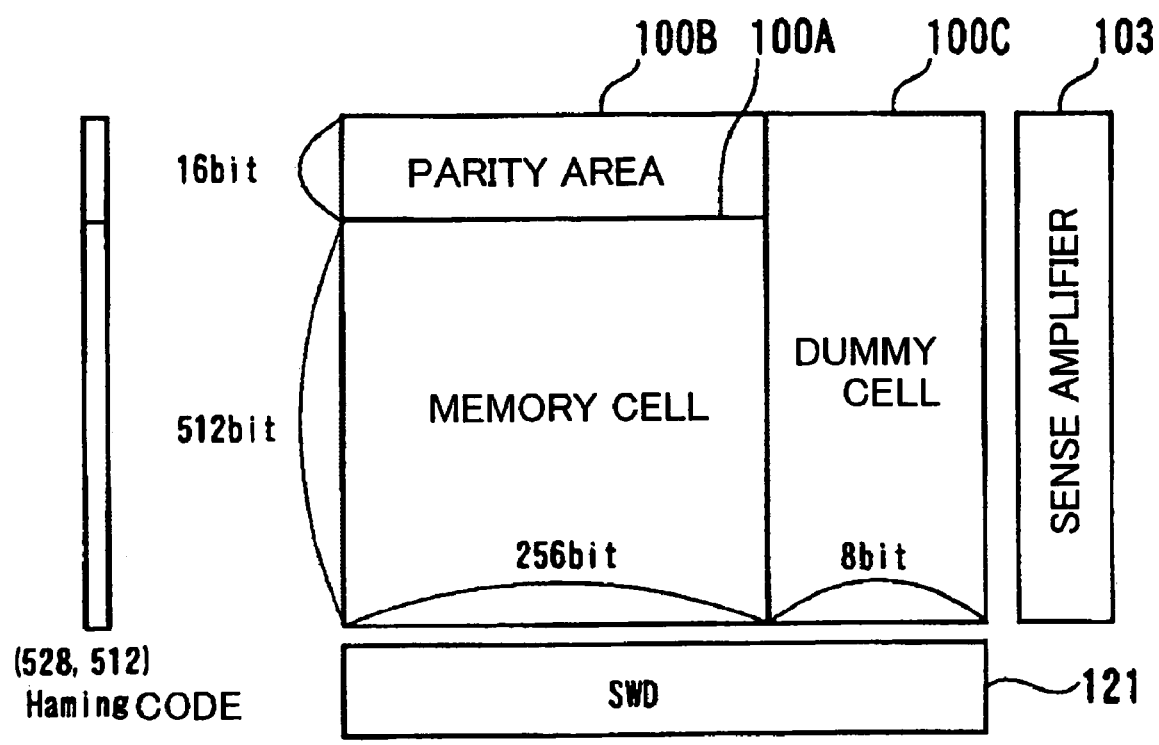
FIG. 4 illustrates the encoding in the first embodiment of the present invention.

FIG. 4 is a diagram showing a typical array configuration for encoding in the embodiment shown in FIG. 2. The data area includes a memory cell area 100A of 256 bits×512 bits (256 sub-word lines and 512 bit lines)=1.28K, a dummy cell area 100C, connected to the sense amplifier 103, by common bit lines, and accessed by eight sub-word lines, and a parity area 100B, having sub-word lines in common with the memory cells of the memory cell area 100A and configured for storing 16-bit parity for 512 bit data. In the present embodiment, the parity is made up by the Hamming codes, with the code length of 528 and with the number of information points of 512, capable of single error correction, as shown in FIG. 4. The dummy cell area 100C is selected by a sub-word line, not shown.

In the present embodiment, the cell data of the memory cell area 100A and the parity area 100B, as selected by the sub-word lines, are amplified by the sense amplifier 103 and re-stored in the cells of the dummy cell 100C as selected by the sub-word line.

The data copied in the dummy cell area 100C is written in the cells of the memory cell area 100A and the parity area 100B. That is, in selecting the refresh period of the step S104 of FIG. 1, the cell data of the sub-word line, associated with the refresh address, is copied for the time being in the dummy cell area 100C. The refresh address is refreshed at a preset period and, if there is error in the data, the refresh period of the sub-word line in question is set to a short period. The data copied in the dummy cell area 100C is returned, in a controlled manner, as cell data of the sub-word line associated with the refresh address. The dummy cell area 100C is refreshed with a short period or with a long period.

Moreover, as shown in a step S103 of FIG. 1, the parity of the Hamming code (check bit) of the memory cell of the row address being accessed is generated by the encoder 115 of FIG. 2 and written in a parity cell 100B of the row address being accessed. A set of the encoder 115 is provided for one bank 100.

Figure 5:
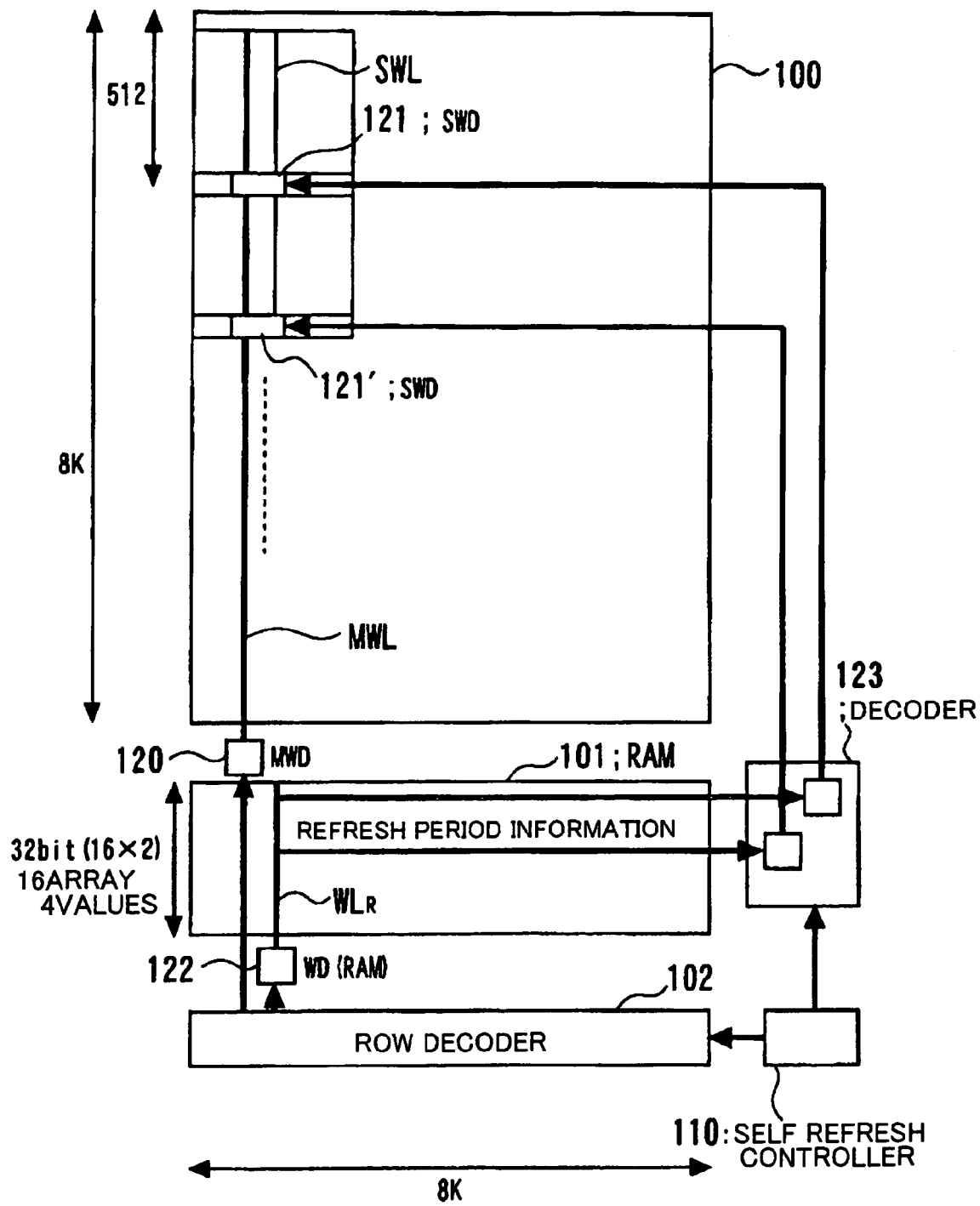
FIG. 5 illustrates readout of the refresh information in the first embodiment of the present invention.

FIG. 5 illustrates the refresh operation and configuration in the present embodiment shown in FIG. 2. In the example shown in FIG. 5, the refresh period is four-valued and the refresh period types are specified with two bits in the RAM 101.

Referring to FIG. 5, a decoder 123 is supplied with and decodes a refresh period for a relevant sub-word line, read out from the RAM 101, accessed with the word line $WL_R$ associated with the refresh address and, based on the decoded results, controls the activation of the sub-word driver (SWD) 121, from one sub-word line of the memory array to another.

During the refreshing, a refresh address from the self refresh controller 110 is supplied to the row decoder 102 to activate a selected main word line through the main word driver (MWD) 120. The word driver (WD) 122 for the RAM activates the selected word line $WL_R$ of the RAM 101 and decodes the refresh period information read out from the RAM 101 (2 bits in case the refresh period information is four-valued) in the decoder 123 to control the refreshing based on the decoded results.

If there are 16 memory arrays, each comprising 512 bit line pairs, 16×2=32 bit cells are arranged per each word line $WL_R$ in the RAM 101 for 16 sub-word lines connected to a sole main word line. In the present embodiment, one of four types of the refresh periods, specified by two bits, is set per sub-word line (8K) of 16 memory arrays. That is, the refresh period type information is set in terms of a sub-word line of each memory cell array of the bank 100. The decoder 123 decodes the refresh period type of the relevant sub-word line to control the activation of the sub-word driver. During the self-refresh operation, the self refresh controller 110 manages control for carrying out the refresh operation with a long term T (for example, S105 of FIG. 1) for N short periods T/N (S109 of FIG. 1), and supervises the current refreshing period type (long period or short period), as shown in the flowchart of FIG. 1. This information is also sent to the decoder 123 during the refresh operation. That is, in case the refresh period information, read out from the RAM 101, coincides with the refresh period for the current refresh address, the decoder 123 of FIG. 5 activates the sub-word driver for the refresh address. It is possible to manage sub-word line based refreshing control, in such a manner that, in case of a refresh with the short term T/N, the sub-word driver(s) 121 set to a short period is activated to refresh the corresponding sub-word line(s) connected to a given main word line, while the sub-word driver(s) 121' set to a long period T is not activated and hence does not refresh the corresponding sub-word line(s) connected to the same main word line.

Figure 6:
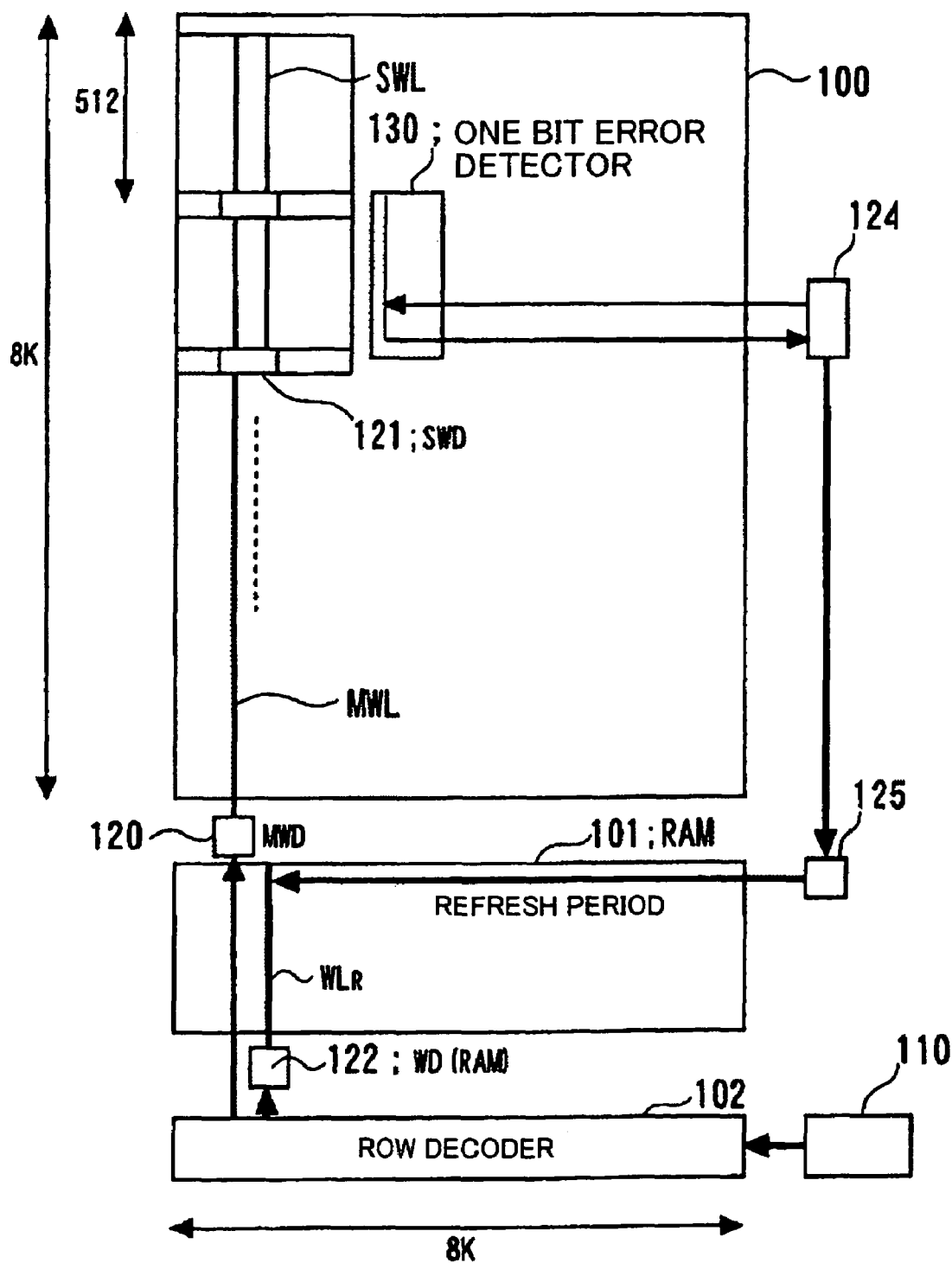
FIG. 6 illustrates error detection and error correction in the first embodiment of the present invention.

FIG. 6 illustrates error detection and error correction operations during the refresh operation in the embodiment shown in FIG. 2. Referring to FIG. 6, error detection and correction are performed every sub-word line. A one-bit error detector 130 is provided in the memory array. During the refresh operation, the refresh address from the self refresh controller 110 is decoded by the row decoder 102 to effect activation of the sub-word line connected to the main word line MWL associated with the refresh address, followed by amplification and re-storing by the sense amplifier (103 of FIG. 2). On error detection by the one-bit error detector 130, a detector 124, supplied with an output of the one-bit error detector 130, corrects the error, and writes data, corrected for the error, in a memory cell via sense amplifier (103 of FIG. 2). On receipt of the output from the decoder 124, the one-bit error detector 130 updates the refresh period of the sub-word line, corrected for errors, to a short period, and records it from a write buffer 125 in a memory cell in a word line $WL_R$ of the RAM 101 selected by the word line $WL_R$ and which is associated with the sub-word line in question. Meanwhile, in the example shown in FIG. 6, the one-bit error detector 130 is provided at a rate of one per sub-array made up e.g. by 256 word lines ands 512 bit line pairs, such that 32 one-bit error detectors 130 are provided per one memory cell array having 8K word lines (32 sub-arrays), these 32 one-bit error detectors 130 corresponding to the error detector 113 of FIG. 2. 16 error detectors 113 are provided per bank, while 512 one-bit error detectors 130 are provided per bank. On the other hand, the decoder 124 is associated with the decoder 114 of FIG. 2. In the RAM 101, the refresh period information is formed by two bits, with the number of cells connected to the sole word line $WL_R$ being 16×2.

Figure 7:
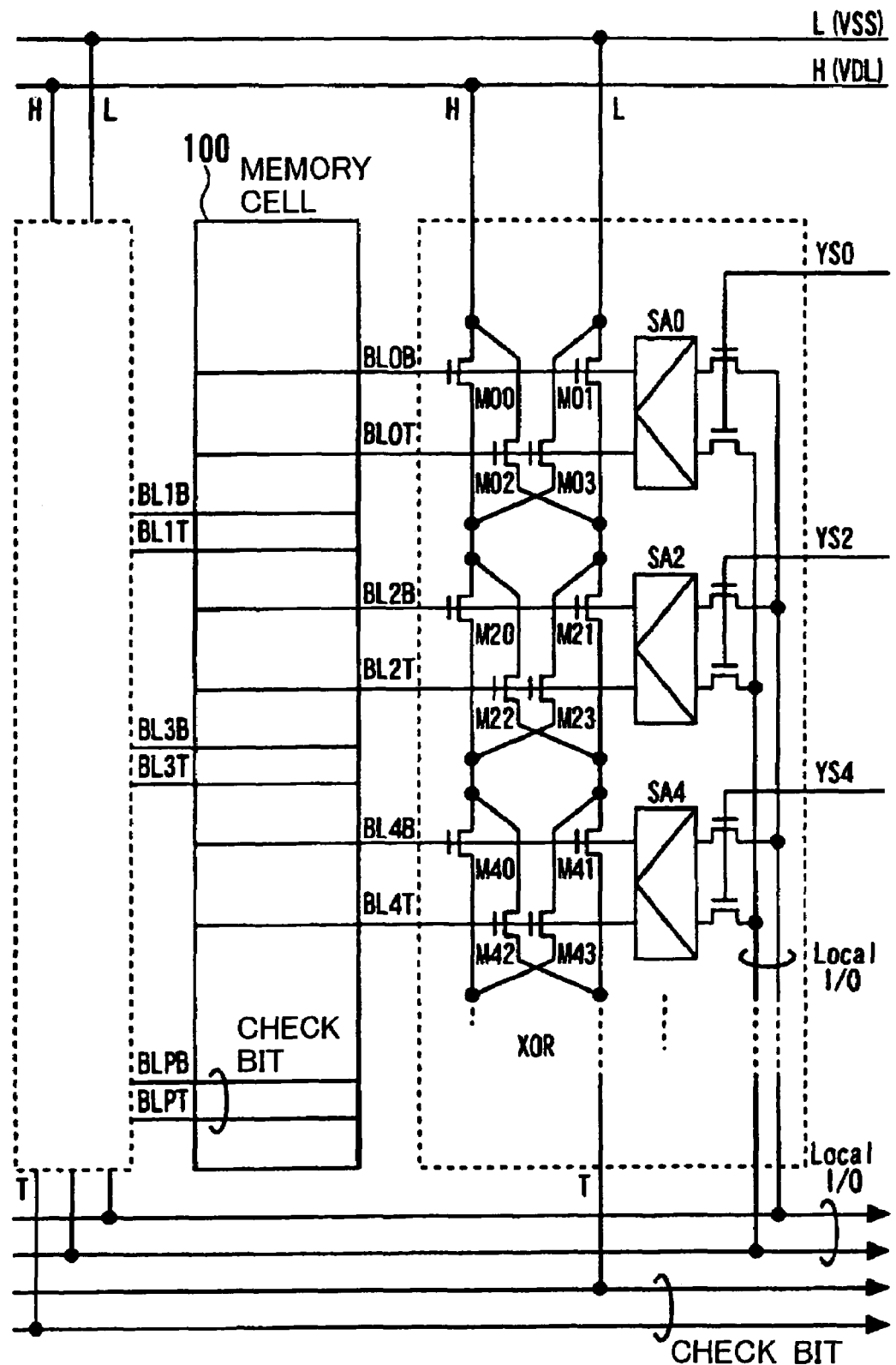
FIG. 7 is a diagram showing the configuration of a one bit error detector in the first embodiment of the present invention.

FIG. 7 is a diagram showing a typical circuit configuration of the one-bit error detector 130 provided in the array shown in FIG. 6. Referring to FIG. 7, there are provided sense amplifiers SA0, SA2, SA4, ... , connected to complementary bit line pairs BL0B and BL0T, bit line pairs BL2B and BL2T and bit line pairs BL4B and BL4T, ... , provided on one side of the memory array 100, while there are provided sense amplifiers SA0, SA2, SA4, ... , not shown, connected to bit line pairs BL1B and BL1T, bit line pairs BL3B and BL3T and bit line pairs BLPB and BLPT for check bits, provided on the other side of the memory array 100. The differential outputs of the sense amplifiers, connected to the bit line pairs, are connected to local input/output lines (Local I/O) via column switches, the gates of which are connected to column selection lines YS0, YS2, .... The one-bit error detector (130 of FIG. 6) includes XOR circuits, provided across the memory array 100 and the sense amplifiers, connected to the bit lines, and having outputs connected in common to check bits in a wired configuration. That is, the XOR circuit includes MOS transistors M00, M01, having gates connected to the bit line BL0B, and MOS transistors M02, M03, having gates connected to the bit line BL0T. The drains of the MOS transistors M00, M02 are connected to a power supply line H(VDL), the drains of the MOS transistors M01, M03 are connected to a power supply line L(VSS), the sources of the MOS transistors M00, M03 are connected in common and the sources of the MOS transistors M01, M02 are connected in common. As for the bit lines BL1B and BL1T, there are provided a sense amplifier SA 1, not shown, and an XOR circuit. As for the bit lines BL2B and BL2T, there are provided MOS transistors M20 and M21, having gates connected to BL2B and MOS transistors M22 and M23, having gates connected to BL2T. The drains of the MOS transistors M20 and M22 are connected to the common source of the MOS transistors M00 and M03, the drains of the MOS transistors M21 and M23 are connected to the common source of the MOS transistors M01 and M03, the sources of the MOS transistors M20 and M23 are connected in common and the sources of the MOS transistors M21 and M22 are connected in common.

When the bit line pairs BL0T and BL0B, BL2T and BL2B, BL4T and BL4B, ... , are of the same value (high level or low level), e.g. the transistors M02 and M03 (M22 and M23, M42 and M43) are turned on, while the transistors M00 and M01 (M20 and M21, M40 and M41) are turned off and the low level is transmitted to the inspection line (check bit) T. It is noted that the unit transistor circuits turned on/off are of the same combination. For example, if the output of a bit line pair is of a value different from the other bit line pair, a high level is transmitted to the inspection line (check bit) T, hence the action as a coincidence detection circuit (Ex-OR). That is, in case a bit as the inspection subject, connected to a sub-word line, is the same, a low level is output to the inspection line (check bit) T, whereas, if there is a one bit error, a high level is output to the inspection line (check bit) T, hence the action as a one bit error detector (130 of FIG. 6). In case a sense amplifier is provided on each side of the array, a 2-bit check bit line is output to the decoder 124 of FIG. 6 on the array basis. 16×2 of check bit lines of FIG.

7 issues outputs per bank, these outputs being entered to the command decoder 108 of FIG. 2.

Figure 8:
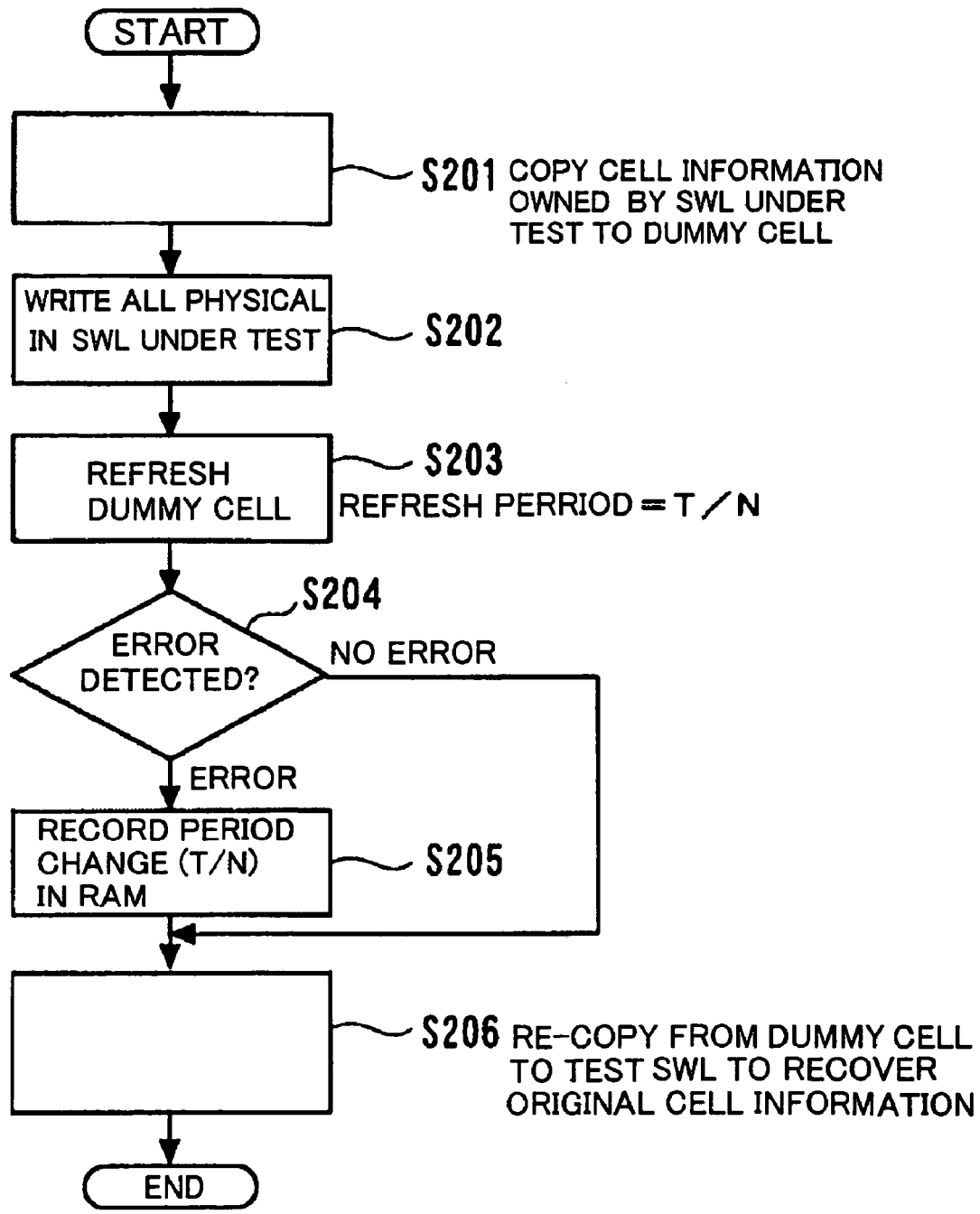
FIG. 8 is a flowchart for illustrating the selecting of a refresh period in the first embodiment of the present invention.

FIG. 8 illustrates the selection of the refresh period (having two values, that is, a long period T and a short period T/N) of the step S104 of FIG. 1.

In a step S201, data held on a memory cell of a sub-word line, being tested for the refresh period (data holding time), is copied in a dummy cell (100C of FIG. 4), connected to the common bit line as the memory cell and which has the sense amplifier in common.

In the next step S202, data with the cell potential being the high level (a value which becomes a high level for a read-out value of a memory cell, termed 'Physical 1') is written in a memory cell of the sub-word line being tested.

In the next step S203, the dummy cell is refreshed with a short period, such as T/N.

In the next step S204, the memory cells of the sub-word line being tested are checked as to whether or not an error of the cell data has been detected with the refresh period tref=T. If an error has been detected, the refresh period of the sub-word in question is changed in a step S205 from T to the short period T/N, and the refresh period information (2 bits) so changed is written in the RAM 101. Then, processing transfers to the next step S206. In case no error has been detected with the refresh period tref=T in the memory cells of the sub-word line being tested, processing jumps to the step S206, without updating the contents of the RAM 101.

In the step S206, data is copied from the dummy cell to the memory cell of the sub-word line being tested, for restoration to the original cell information.

In determining the refresh period for the sub-word line being tested, in the present embodiment, it is checked whether or not an error has been detected, as the refresh period is extended e.g. from the short period to the long period. If an error is detected, the refresh period is set to a shorter period than the refresh period for which the error has occurred.

Figure 9A:
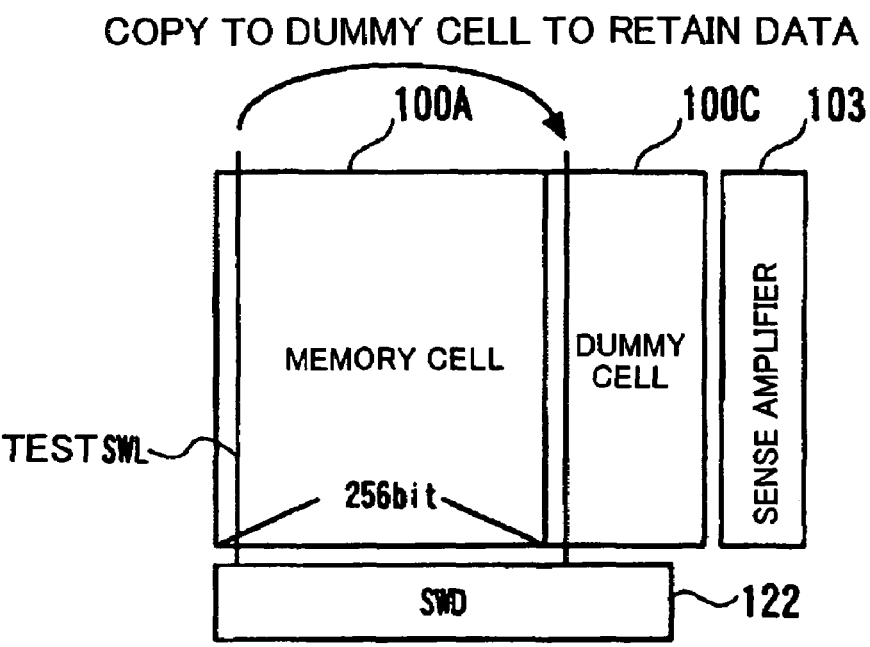
FIGS. 9A, 9B and 9C illustrate the copying to a dummy cell in the first embodiment of the present invention.
Figure 9B:
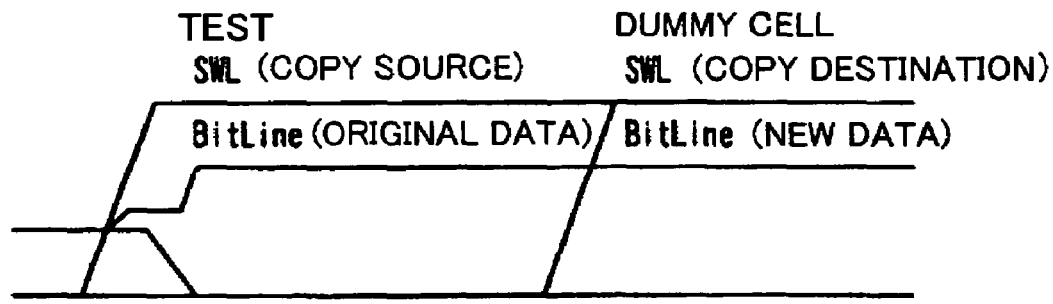
Figure 9C:
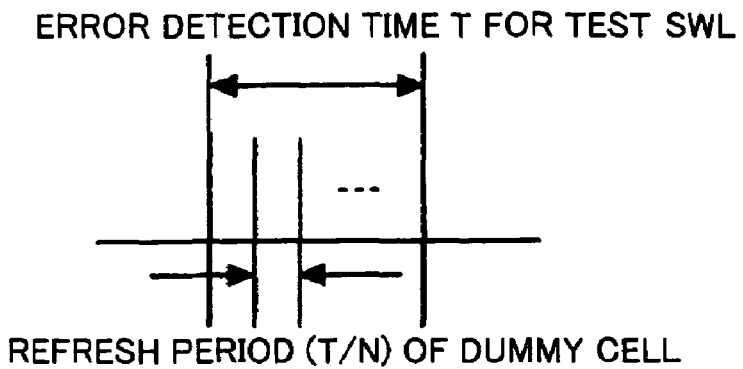

FIGS. 9A, 9B and 9C illustrate the copying of the cell information of the memory cell of the sub-word being inspected. Referring to FIG. 9A, the data of the sub-word line SWL of the memory cell area 100A being tested is copied to the dummy cell area 100C.

Referring to FIG. 9B, the sub-word line SWL of the copying source is activated (set to a high potential). The sense amplifier amplifies cell data output to a bit line pair to activate the sub-word line SWL as the copying destination. The cell data, differentially amplified by the sense amplifier, is re-stored in the memory cell of the copying source, while being written in the dummy cell as the copying destination.

If, as shown in FIG. 9C, the refresh period (error detection time) of the memory cell of the sub-word line SWL being tested is the long period T, the dummy cell, in which data of the copying source has been written, is refreshed with the short period T/N. The reason is that, even if data of the memory cell of the sub-word line SWL being tested is lost due to cell leakage, data copied in the dummy cell is retained positively.

Figure 10:
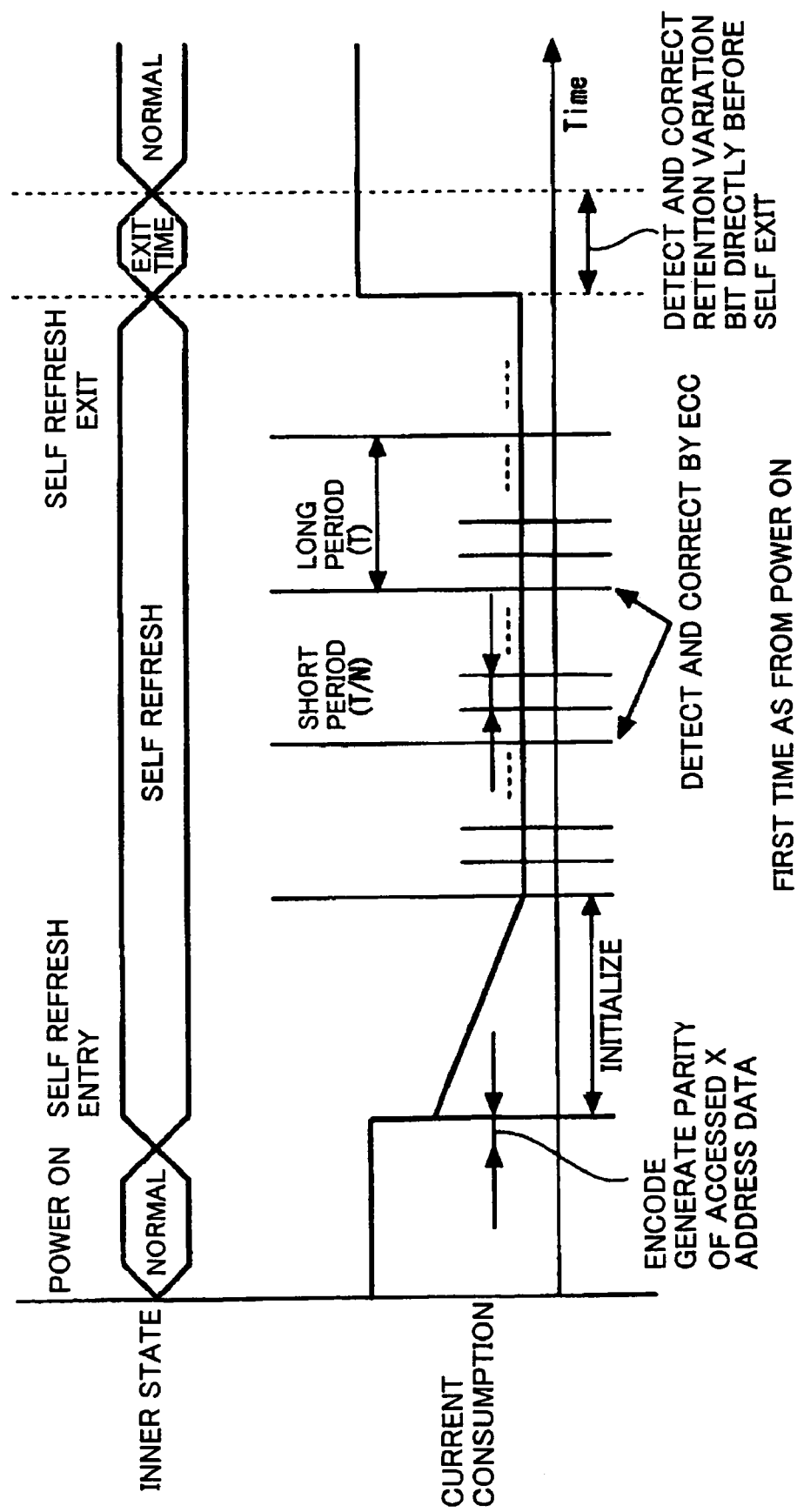
FIG. 10 illustrates the relationship between the current consumption and the transition of the inner state in the first embodiment of the present invention (first one after power up).

FIG. 10 shows the current consumption for the first self refresh operation, as from the time of power up sequence of the present embodiment, in association with the transition of the inner states of a semiconductor storage device from normal, self refresh entry and self refresh as far as self refresh exit and back to normal. In transition from the normal operation to the self refresh entry, not the entire bits but only cell data of the memory cells of the row addresses, accessed during the normal operation, are read out, and the parity is generated to write the data and the parity generated in the memory cells of the row addresses. After the initializing operation in the self refresh entry (selection of the refresh period), the refresh operation for the self refresh operation is carried out with the long period (T). At this time, error detection is carried out by ECC and, should there be any error, such error is corrected (see the step S107 of FIG. 1) and the refresh period of the sub-word in question is set to a short period. The refresh operation for N sub-word lines, with the refresh period of the short period T/N, followed by the refresh operation with the long period T, is carried out. During the exiting time of the self refresh exit, error detection and error correction by burst refresh are carried out by burst refresh (step S113 of FIG. 1). That is, the retention time variation bits directly before self refresh exit (bits that turned out to be error bits at the time of the refresh operation due to retention time variations and cell leakage) are corrected for errors. With the above configuration, it is possible to reduce current consumption at the time of the refresh operation.

Figure 11:
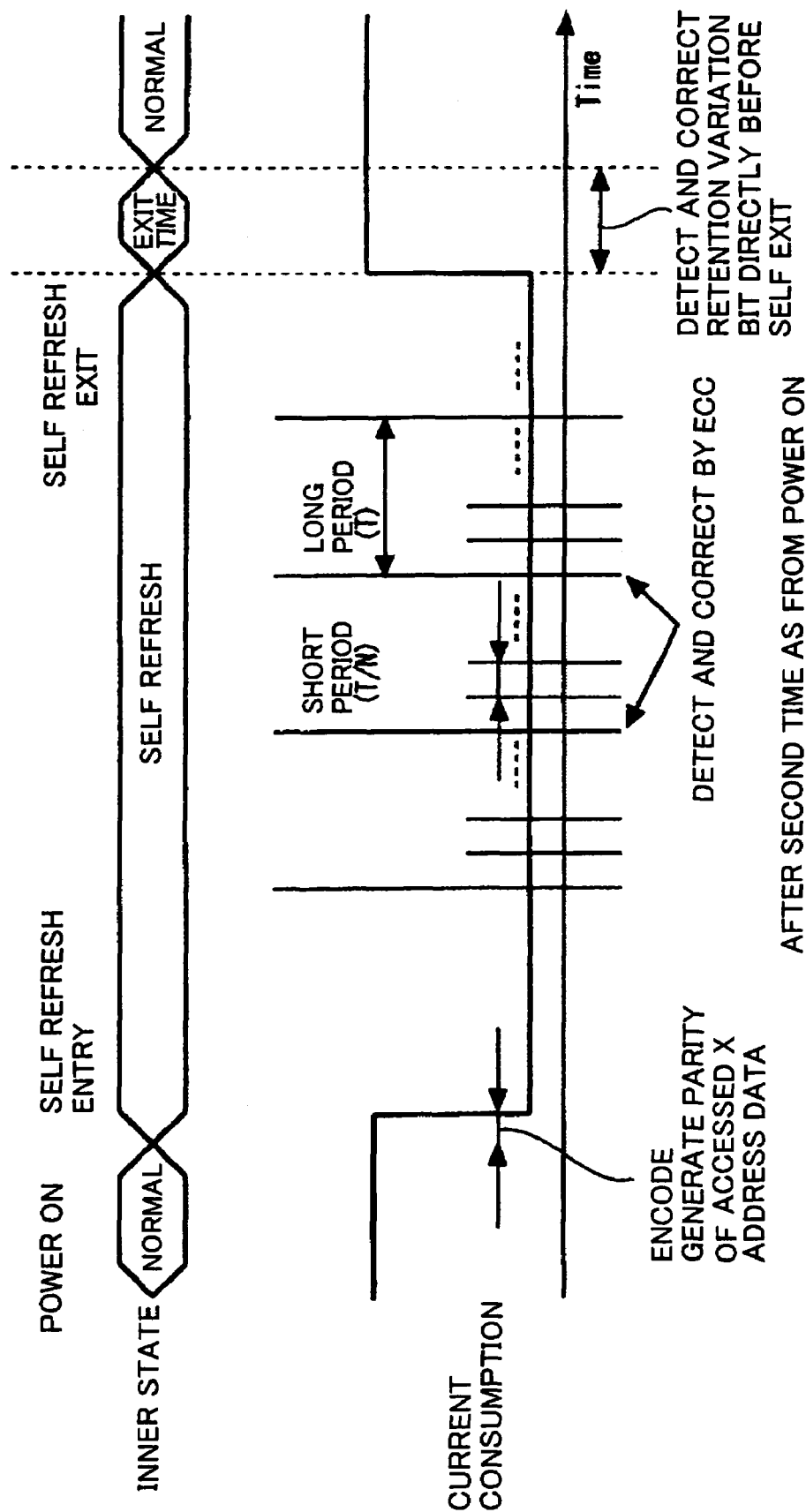
FIG. 11 illustrates the relationship between the current consumption and the transition of the inner state in the first embodiment of the present invention (second one after power up).

FIG. 11 shows the current consumption for the second self refresh operations ff. as from the time of power up sequence of the present embodiment, in association with the transition of the inner states from normal, self refresh entry and self refresh as far as self refresh exit and back to normal. In transition from the normal operation to the self refresh entry, only cell data of the memory cells of the row addresses, accessed during the normal operation, are read out, and the parity is generated to write the data and the parity generated in the memory cells of the row addresses. In distinction from the case of the first self refreshing operation, shown in FIG. 10, the initializing operations, shown in FIG. 10, such as selection of the refresh periods, is not carried out in the second and the following self refresh operations as from power up sequence. The second and the following self refresh operations are otherwise the same as the first self refreshing operation.

Figure 12:
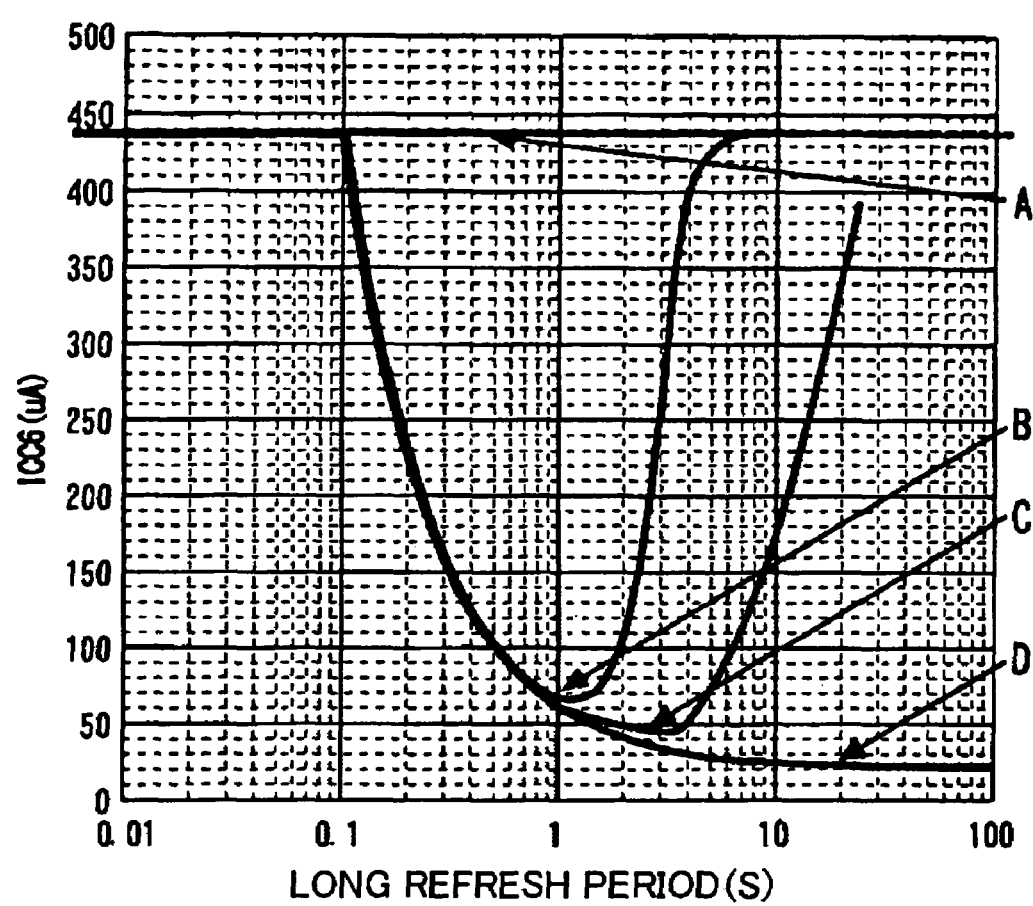
FIG. 12 illustrates the relationship between the refresh period and a standby power supply current ICC6 of a 256M-DRAM in the first embodiment of the present invention.

FIG. 12 shows the relationship between the refresh period of the 256M-DRAM (abscissa: log scale) and the power supply current ICC6 during the standby time of the 256M-DRAM. Specifically, FIG. 12 shows the power supply current ICC6 during the standby time derived from the cumulative frequency distribution of the retention time on the actual device, with the Poisson distribution as premises. This current ICC6 is also called the 'self refresh current'. The temperature is 85° C.

In a curve A of FIG. 12, usually the refresh tREF=100 ms and ICC6=440 μA. In FIG. 12, a curve B stands for an adaptive refresh characteristic in which the sub-word line based refresh period is two-valued, with ICC6=70 μA. There are two tREFs, namely the short period=100 ms and the long period is 1s. In FIG. 12, a curve C stands for an adaptive refresh characteristic in which the sub-word line based refresh period is four-valued, with ICC6=50 μA. There are four tREFs, namely the short period=100 ms and the long periods are 1s, 2s and 4s. In FIG. 12, a curve D stands for a characteristic showing the relation between the refresh period and the ICC6.

Under the same conditions, the self refresh current (ICC6) of a conventional DRAM is 440 μA, while that of an SSR is 60 μA and the adaptive refresh with ECC of the present embodiment is 70 μA.

With the adaptive refresh of the present embodiment by sub-word line based selective control between the long and short periods, the number of the memory cells, carrying out short-period refresh, may be suppressed to a few percent of the memory cells (256M) in the bank, thereby decreasing the self refresh current.

Moreover, with the present embodiment, the number of rejects following package assembling of the DRAM devices (and hence after product shipment) may be suppressed by detecting the failure caused by defects in retention time variations during self refresh by the ECC circuit.

Figure 13:
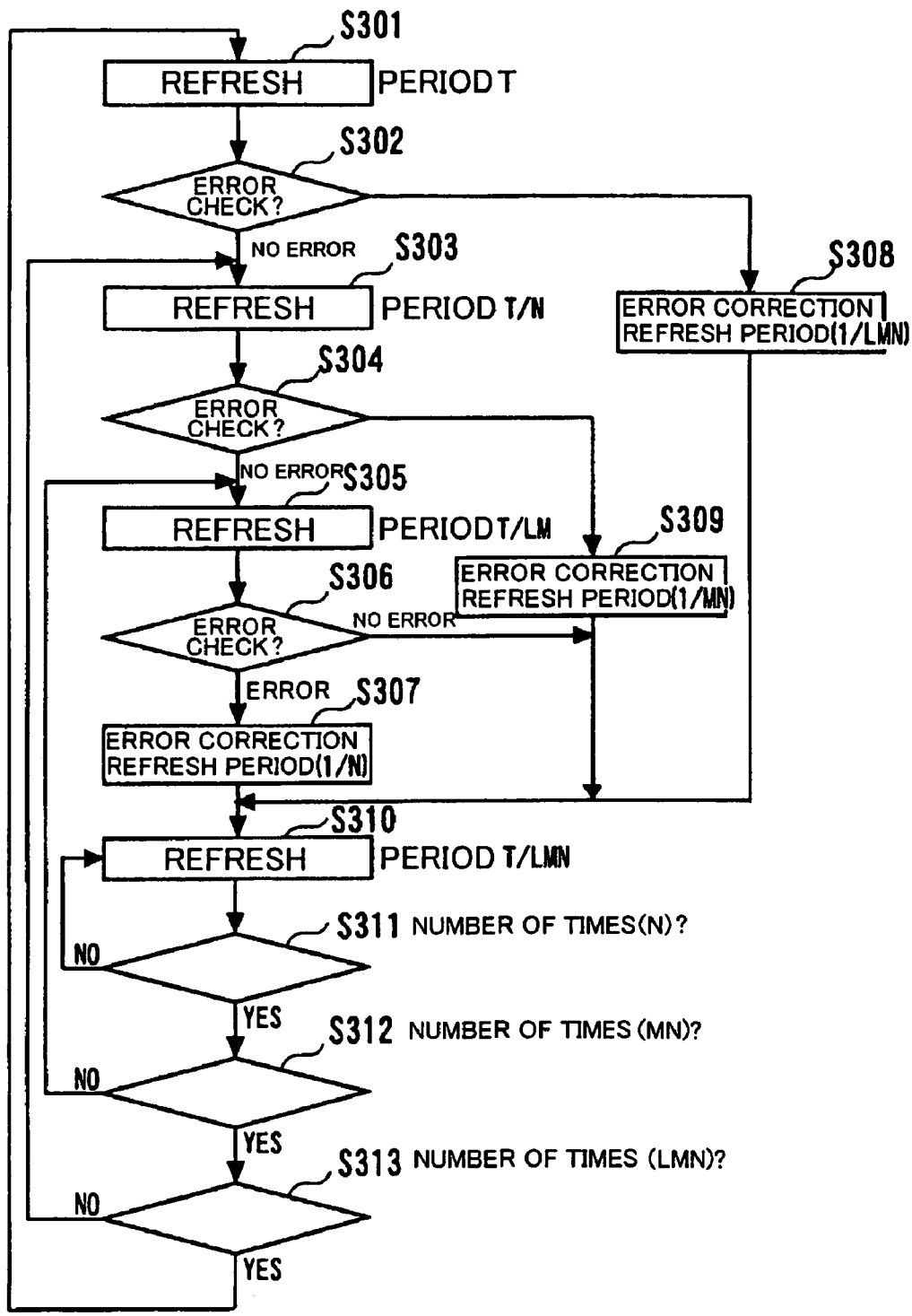
FIG. 13 is a flowchart for illustrating the processing of a four-value adaptive refresh period according to a second embodiment of the present invention.

FIG. 13 is a flowchart for illustrating the processing sequence for adaptive refresh in case the refresh period in the semiconductor storage device of the present embodiment shown in FIG. 2 is four-valued. In an initial step in FIG. 13, refresh is carried out with a long period T.

In the next step S302, it is checked whether or not any error has been caused in the cell refreshed with the long period T.

If there is no error in the step S302, refresh is carried out in the next step S303 with a refresh period T/L and, in the next step S304, it is checked whether or not there is any error in the cell refreshed with the period T/L. If there is no error in the check in the step S304, the refresh period is set to T/LM in the next step S305 and, in the next step S306, it is checked whether or not there is any error in the cell refreshed with the period T/LM. If there is any error in the step S306, it is corrected in the next step S307, and the refresh period type is set to 1/N.

If there is any error in the above step S302, it is corrected and the refresh period is shortened to 1/LMN of T (step S308).

If there is any error in the above step S304, it is corrected and the refresh period is shortened to 1/MN of T (step S308).

In steps S310 and S311, the refresh with the refresh period T/LMN is carried out N times.

After N refresh operations, with the refresh period of T/LMN, it is checked in a step S312 whether or not the refresh with the refresh period T/LM has been carried out MN times. If the refresh has not been carried out MN times, processing reverts to the step S305 to carry out the refresh with the refresh period T/LM by MN times.

In the next step S313, it is checked whether or not the refresh with the refresh period T/L has been carried out by LMN times. If the refresh has not been carried out by LMN times, processing reverts to the step S303 to carry out refresh with the refresh period T/L by LMN times.

Figure 14:
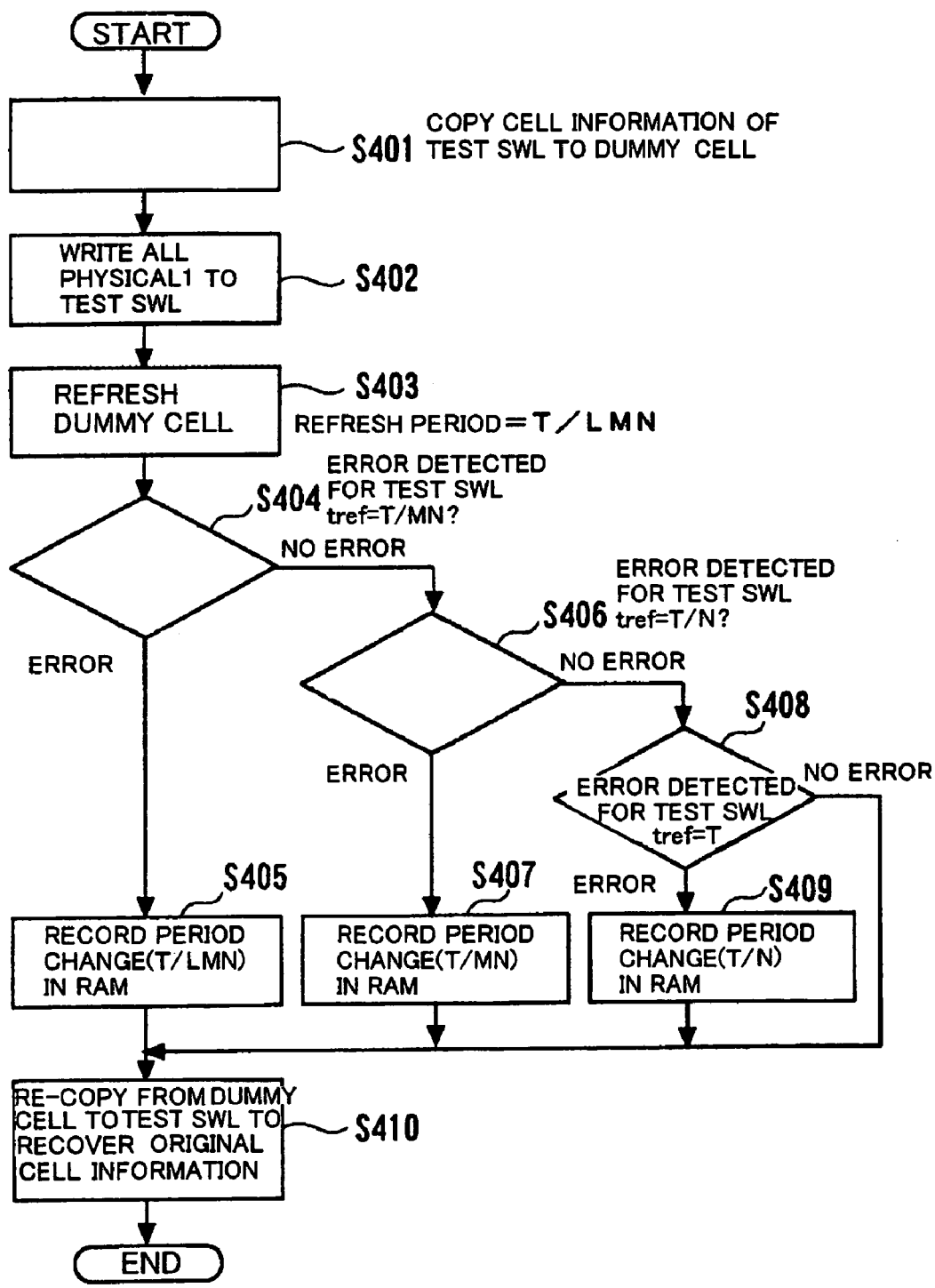
FIG. 14 is a flowchart for illustrating the selecting processing of the four-value adaptive refresh period according to a second embodiment of the present invention.
Figure 15:
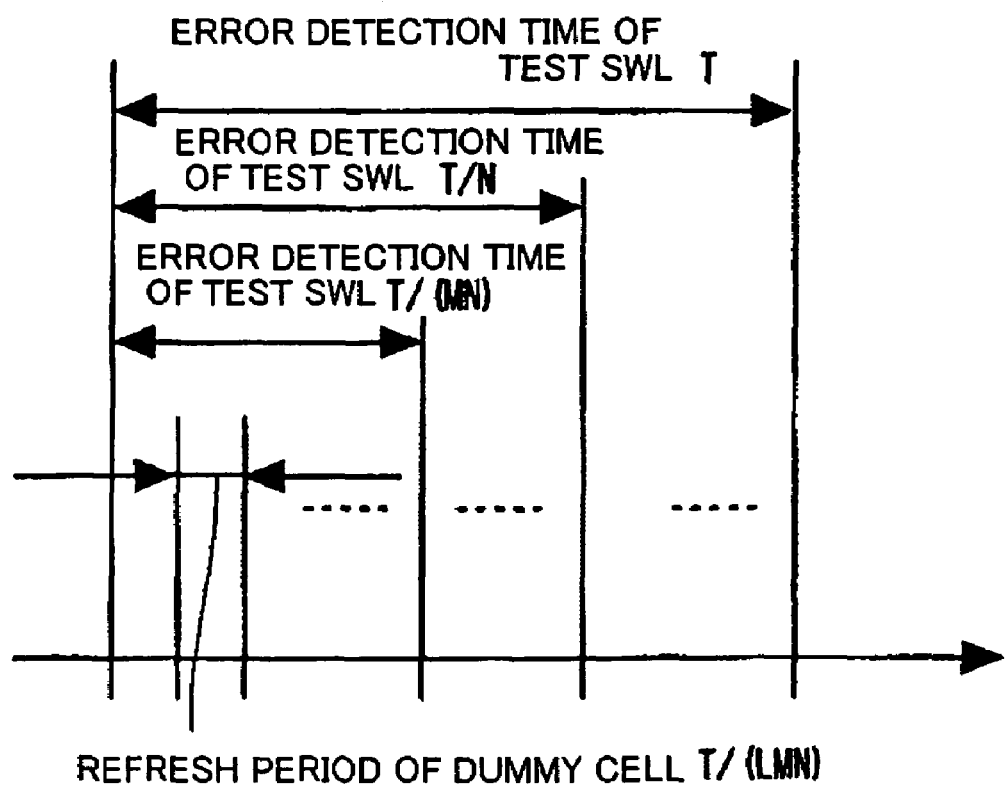
FIG. 15 illustrates the selecting processing of the four-value adaptive refresh period according to a second embodiment of the present invention.

FIGS. 14 and 15 are flowcharts for illustrating the four-valued adaptive refresh processing sequence. The four-valued adaptive refresh processing sequence has, as refresh periods, four values, namely T/(LMN), T/(MN), T/N and T, in the rising order, as shown in FIG. 15. The dummy cells (100C of FIG. 4) are refreshed with the shortest period of T/(LMN), as shown in FIG. 15.

In a step S401, data of memory cells of the sub-word line SWL, being tested, are copied in dummy cells.

In the next step S402, data (Physical 1) is written in memory cells of the sub-word line SWL being tested.

In the next step S403, the dummy cells are refreshed with the shortest period of T/(LMN).

In the next step S404, an error in case the sub-word line SWL being tested is refreshed with the refresh period tref=T/(MN) is detected.

If an error has been detected in the step S404, the refresh period is changed in the next step S405 to T/(LMN) for writing in a relevant cell in the sub-word line in question of the RAM 101 (see FIGS. 2 and 6). Then, processing transfers to a step S410.

If there is no error in the step S404, processing transfers to a step S406 to detect an error with the refresh period tref=T/N of the sub-word line SWL being tested.

If an error has been detected in the step S406, the refresh period is changed in the next step S407 to T/(MN) for writing in a relevant cell in the sub-word line in question of the RAM 101 (see FIGS. 2 and 6). Then, processing transfers to the step S410.

If there is no error in the step S406, processing transfers to a step S408 to detect an error with the refresh period tref=T of the sub-word line SWL being tested. If an error has been detected in the step S408, the refresh period is changed in the next step S409 to T/(N) for writing in a relevant cell for the sub-word line in question of the RAM 101 (see FIGS. 2 and 6). Then, processing transfers to the step S410. If there is no error in the step S408, processing transfers to the step S410.

In the step S410, the source data is copied from the dummy cell to the memory cell of the sub-word line being tested.

Figure 16:
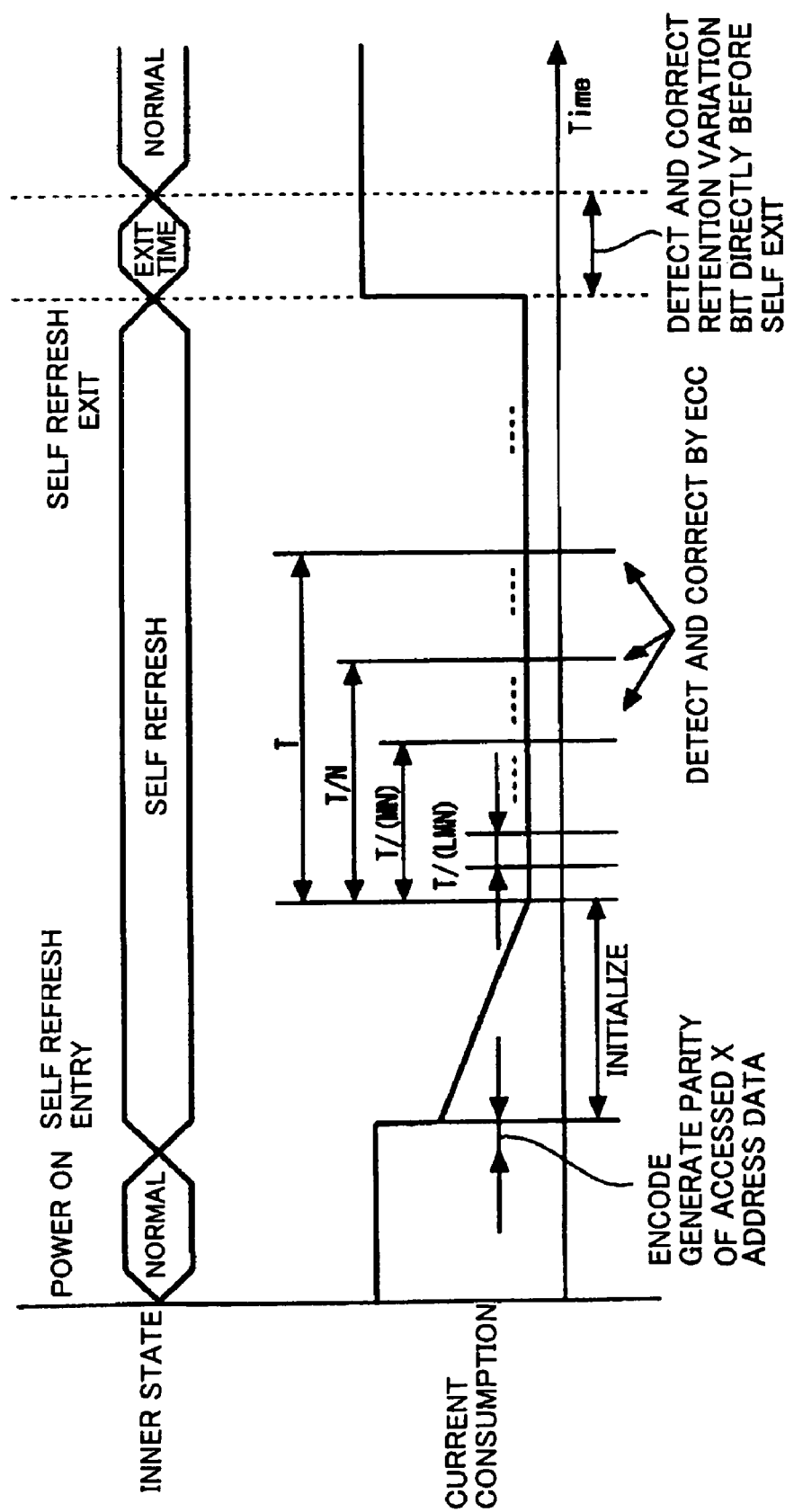
FIG. 16 illustrates the relationship between the current consumption and the transition of the inner state in the second embodiment of the present invention (first one after power up).

FIG. 16 shows the relationship between the current consumption and the inner state during the first cell refresh following power up sequence in the four-valued adaptive refresh. At the time of the self refresh entry as from the normal operation, the parity of the data of the row address accessed is generated and written in the parity area. As for initializing operations for four-valued adaptive refresh, following power up sequence, the totality of bits is read three times. After the initializing operations, the standby state is set, and refresh is carried out with the periods of T/(LMN), T/(MN), T/(N) and T. The error detection and correction are carried out with the periods of T/(LMN), T/(MN), T/(N) and T, out of the four periods. The error detection and correction are carried out during the exit time in self refresh exit.

Figure 17:
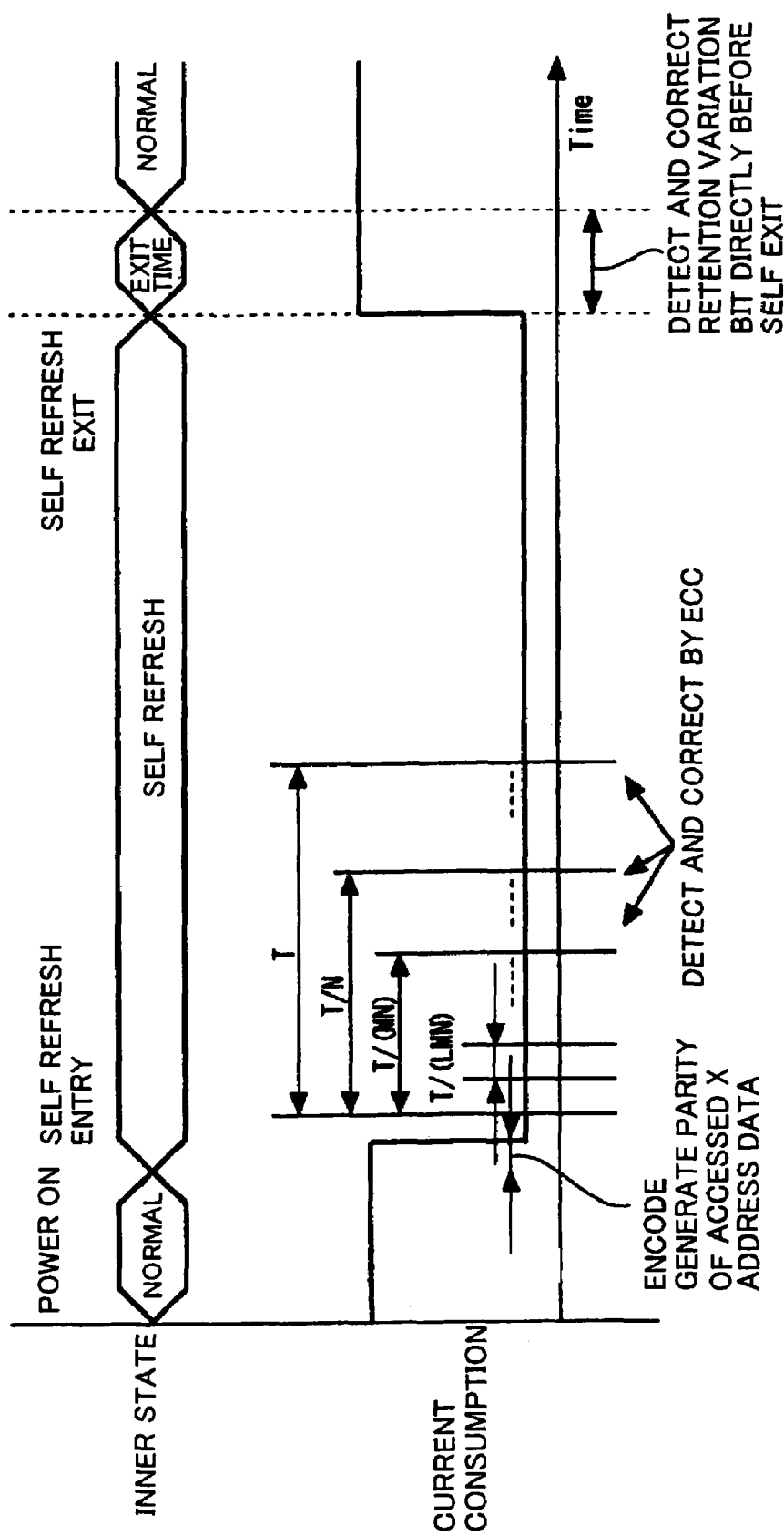
FIG. 17 illustrates the relationship between the current consumption and the transition of the inner state in the second embodiment of the present invention (second one after power up).

FIG. 17 shows the relationship between the current consumption and the inner state during the second cell refresh following power up sequence in the four-valued adaptive refresh in the second embodiment of the present invention. Referring to FIG. 17, the first initializing operation following power up sequence of FIG. 16 (selection processing of the refresh period) is omitted and the refresh operation is carried out with the periods of four types of the refresh periods (T/(LMN), T/(MN), T/(N) and T).

FIG. 18 depicts a table for comparing the Comparative Example (256M-DRAM of the system described in the Patent Publication 2) and the 256M-DRAM of the present embodiment.

In the present embodiment, the chip size is increased by 7.2%. The increase in the chip size is suppressed to 7.2% by recording, in the DRAM memory cells, the information on the sub-word line SWL based refresh period and the information on the row address accessed during the normal operation.

In the present embodiment, the power supply current during the standby time is 50 µA.

In the present embodiment, the self refresh entry time is 200 ms and the entry current is 60 mA. In the Comparative Example, the self refresh entry time is 400 ms and the entry current is 60 mA.

In the present embodiment and in the Comparative Example, the first entry time of self refresh is 64 s. The current is 560 µA. These values are 400 ms and 60 mA, respectively, in the Comparative Example.

In the present embodiment and in the Comparative Example, the exit current (power supply current at the time of exit from the self refresh mode to the normal mode) is 60 mA.

In the present embodiment, the parameter change element of the exit time of self refresh is 6.5 ms, while that of the Comparative Example is 400 ms. That is, if, in the present embodiment, 8K burst refresh and error correction are carried out at the exit time from the self refresh, the time not longer than 10 ms is needed as the self refresh exit time. If, in the present embodiment, no 8K burst refresh nor error correction is carried out at the exit time from the self refresh, there is no exit time as the design parameter changing element.

The present embodiment and the Comparative Example are both capable of coping with the mobile phone terminals.

The present embodiment is not capable of coping with power supply off, whilst the Comparative Example is capable of coping with power supply off.

In the present embodiment, the totality of bits of the row address accessed is read and written after encoding the Hamming codes. At the exit time from the self refresh, the totality of bits is refreshed in a burst fashion once. In the Comparative Example, the product codes are encoded at the entry time to the self refresh (the totality of bits is read twice) and the product codes are decoded at the exit time from the self refresh (the totality of bits is read twice).

In the present embodiment, the totality of bits is read three times, by way of performing the initializing operation for the four-valued adaptive refresh operations, during the first entry following power up sequence. The operation for the Comparative Example is the same as that for usual entry.

Meanwhile, the circuit for storage of sub-word line based refresh periods is not limited to the RAM 101 shown in FIG. 2, and may also be a set of flip-flops (which may also be an SRAM) for storage of the information corresponding to a sub-word line. The circuit may also be a register file. The RAM 101 for storing and managing the RAM 101 during the normal operation may also be formed by a set of flip-flops or a register file.

Figure 19:
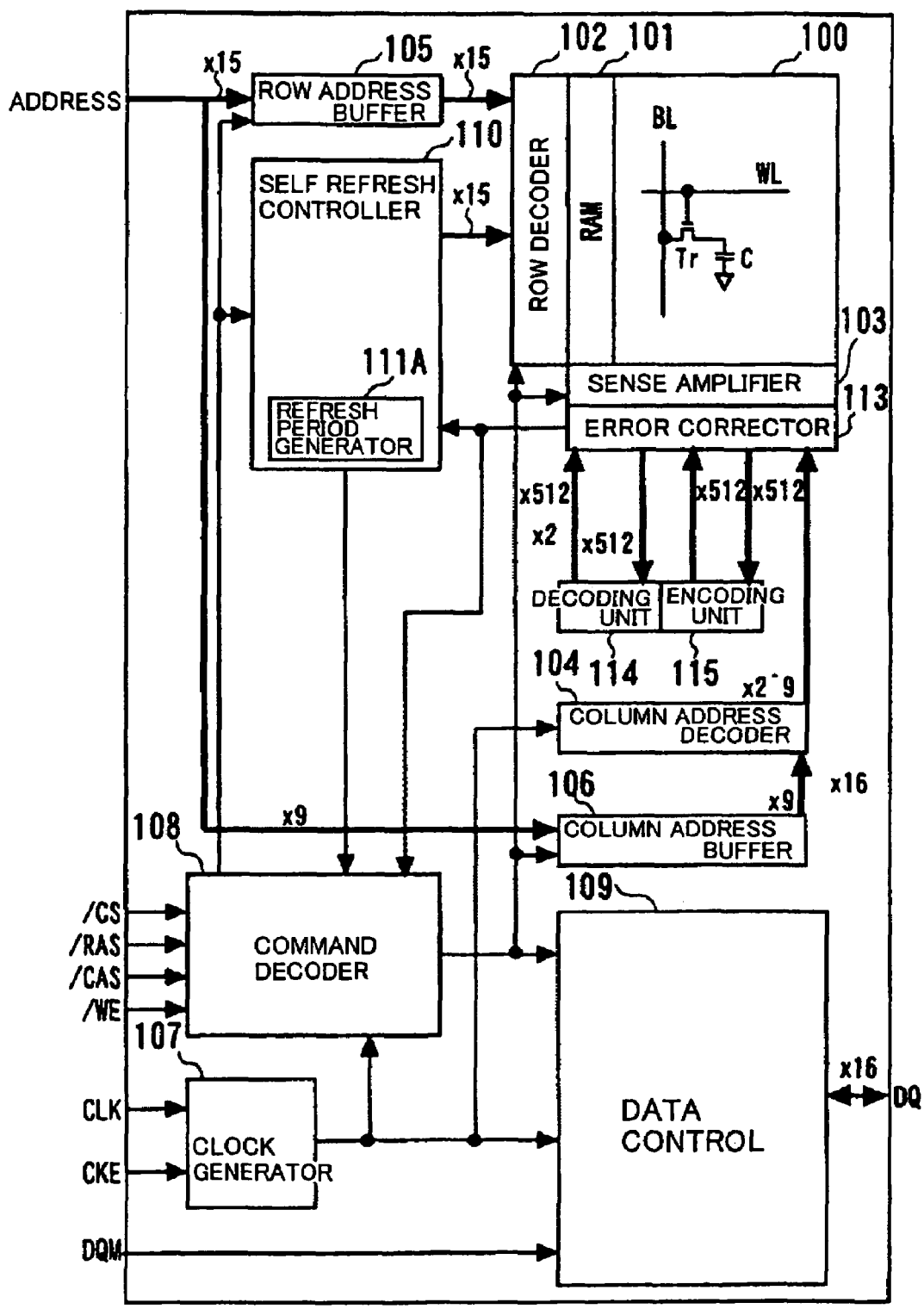
FIG. 19 shows the overall configuration of a third embodiment of the present invention.

FIG. 19 is a diagram showing the configuration of a semiconductor storage device according to another embodiment of the present invention. In FIG. 19, the elements equivalent to those shown in FIG. 2 are indicated by the same reference symbols. The present embodiment has the function of temperature correction of the refresh periods, by error detection, during the self refresh operation. The following explanation is directed to the point of difference of the present embodiment from the previously explained embodiment. Referring to FIG. 19, the present embodiment manages control to change the refresh period by controlling a refresh period generator 111A of the self refresh controller 110 based on the results of error detection from the error detector 113. The present embodiment is otherwise the same in configuration as the previously explained embodiment.

Figure 20:
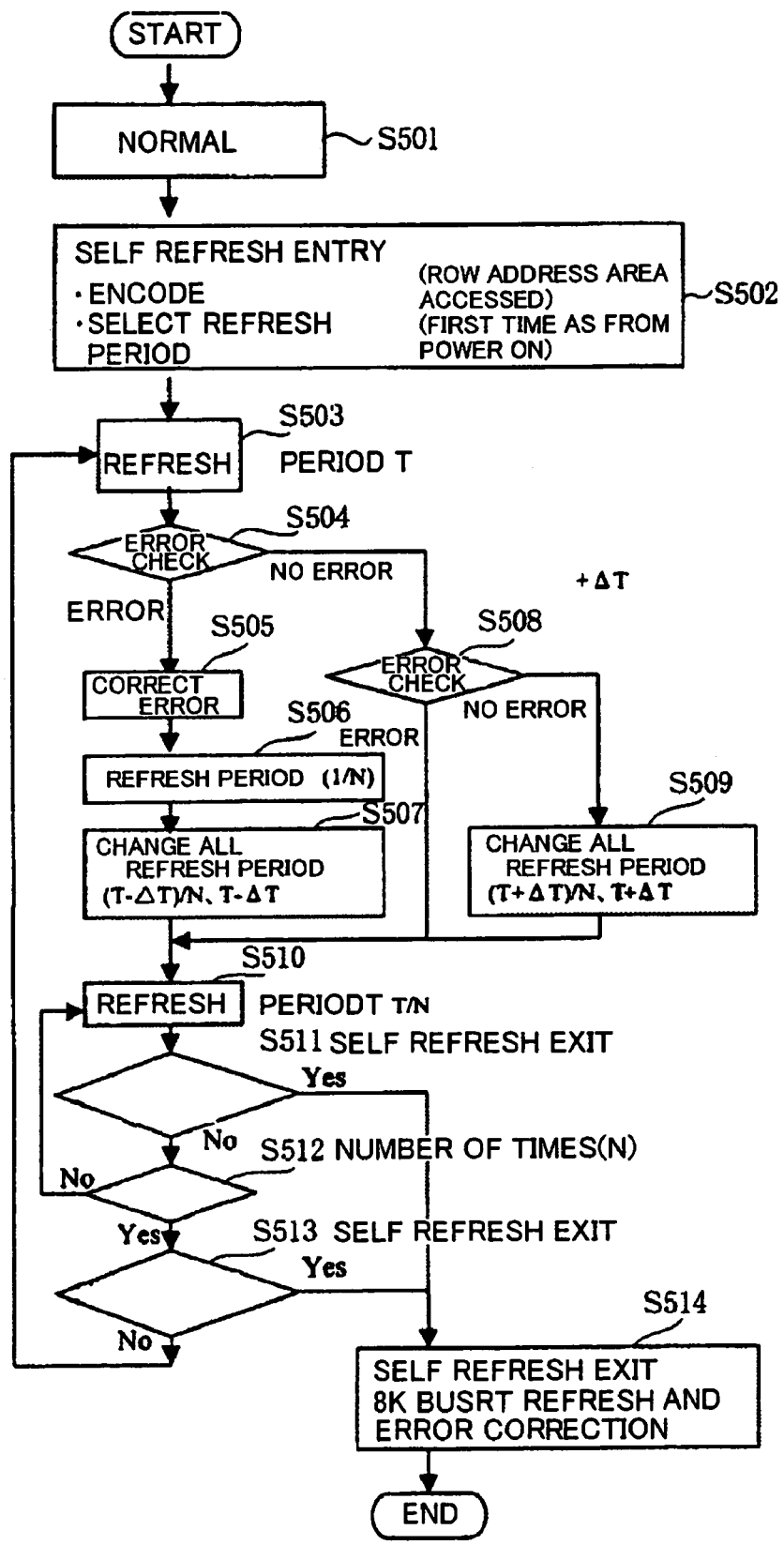
FIG. 20 is a flowchart for illustrating the operation of an embodiment of the present invention.

FIG. 20 is a flowchart for illustrating the operation of the present embodiment. The operation of the present embodiment is now explained with reference to FIGS. 19 and 20. In the following, it is assumed for simplicity that the refresh period is two-valued, that is, of a value of a long period T and a short period T/N, where N is a preset positive integer.

During the normal operation, the row address accessed is stored in the RAM 101 (step S501). At the time of self refresh entry in a step S502, the data of the row address, accessed during the normal operation prior to the self refresh entry, is encoded by the encoder 115. This step corresponds to the step S103 of FIG. 1. If the self refresh entry is the initial one following power up sequence, the refresh period is selected. This step corresponds to the step S104 of FIG. 1. In the next step S503, refresh is carried out with the long period T. An error check is carried out in a step S504 and, if there is any error, such error is corrected in a step S505. The refresh period of the sub-word line, where an error has been detected, is multiplied by 1/N to change the period to the short period T/N. The relevant cell in the RAM 101 is updated (step S506). The reference period T of the totality of the refresh periods is changed to T'=T−ΔT (step S507). A refresh period generator 111A of the self refresh controller 110 sets the refresh period of the long period T to T−ΔT, while setting the short period T/N to (T−ΔT)/N. In the present embodiment, the long period and the short period are shortened by the same proportion.

If no error has been detected in the step S504, the refresh period is set to a longer value of (T+ΔT). If, as a result thereof, an error is detected (YES of the result of error check of a step S508), the change of the totality of the refresh periods is not carried out. If there is no error, the reference period T of the totality of the refresh periods is changed to T'=T+ΔT (step S509). The refresh period generator 111A of the self refresh controller 110 sets the refresh period of the long period T to T+ΔT, while setting the short period T/N to (T+ΔT)/N. In the present embodiment, the long period and the short period are shortened by the same proportion.

In the next step S510, refresh is carried out with the short period T/N and, except if there is issued a command for self refresh exit, self refresh with the short period T/N is carried out N times to carry out self refresh with the long period T (steps S511 to S513 and S503). In exiting from self refresh, 8K word burst refresh and error correction are carried out (step S514).

Figure 21A:
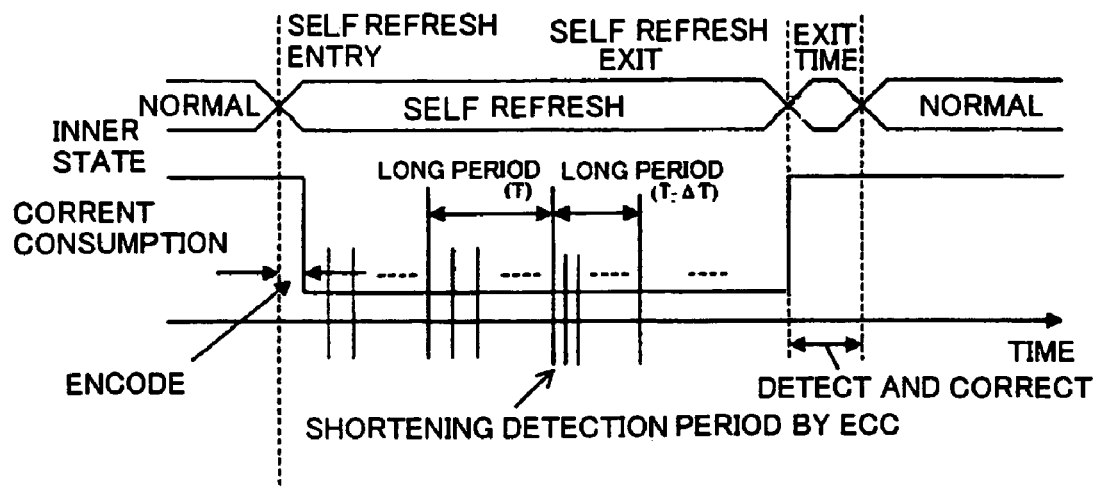
FIGS. 21A and 21B illustrate the relationship between the current consumption and the transition of the inner state in the second embodiment of the present invention (second and following ones one after power up).
Figure 21B:
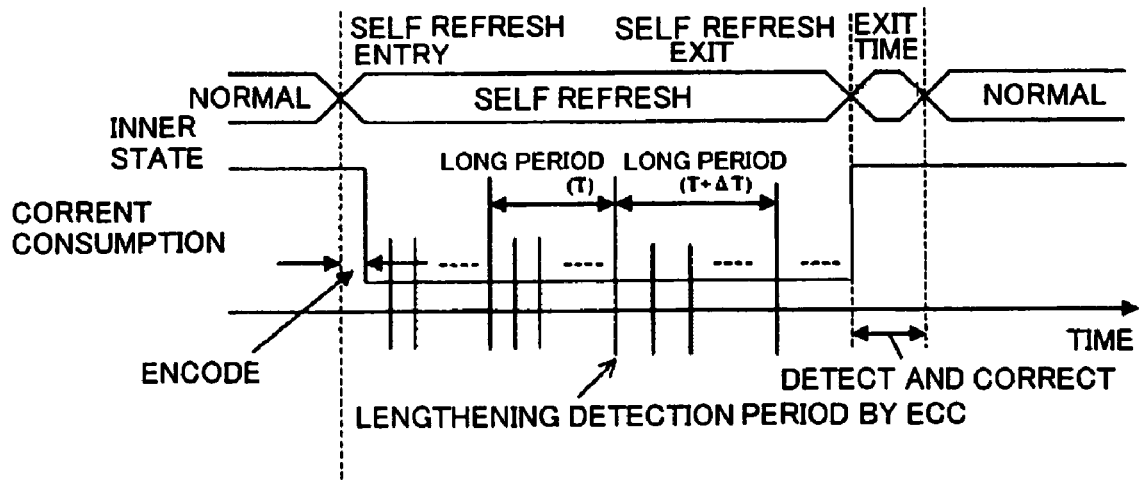
Figure 22:
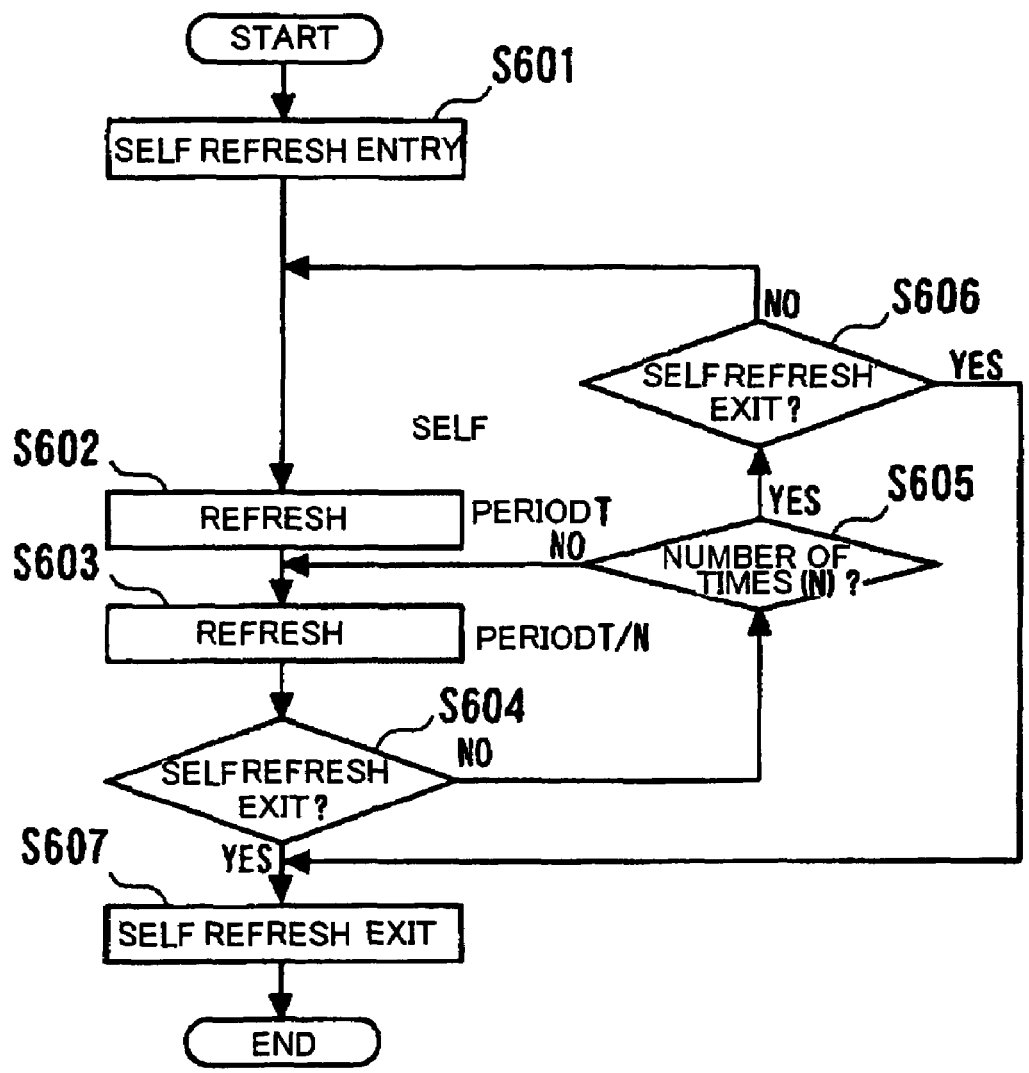
FIG. 22 is a flowchart for illustrating an example of the conventional refresh control.
Figure 23:
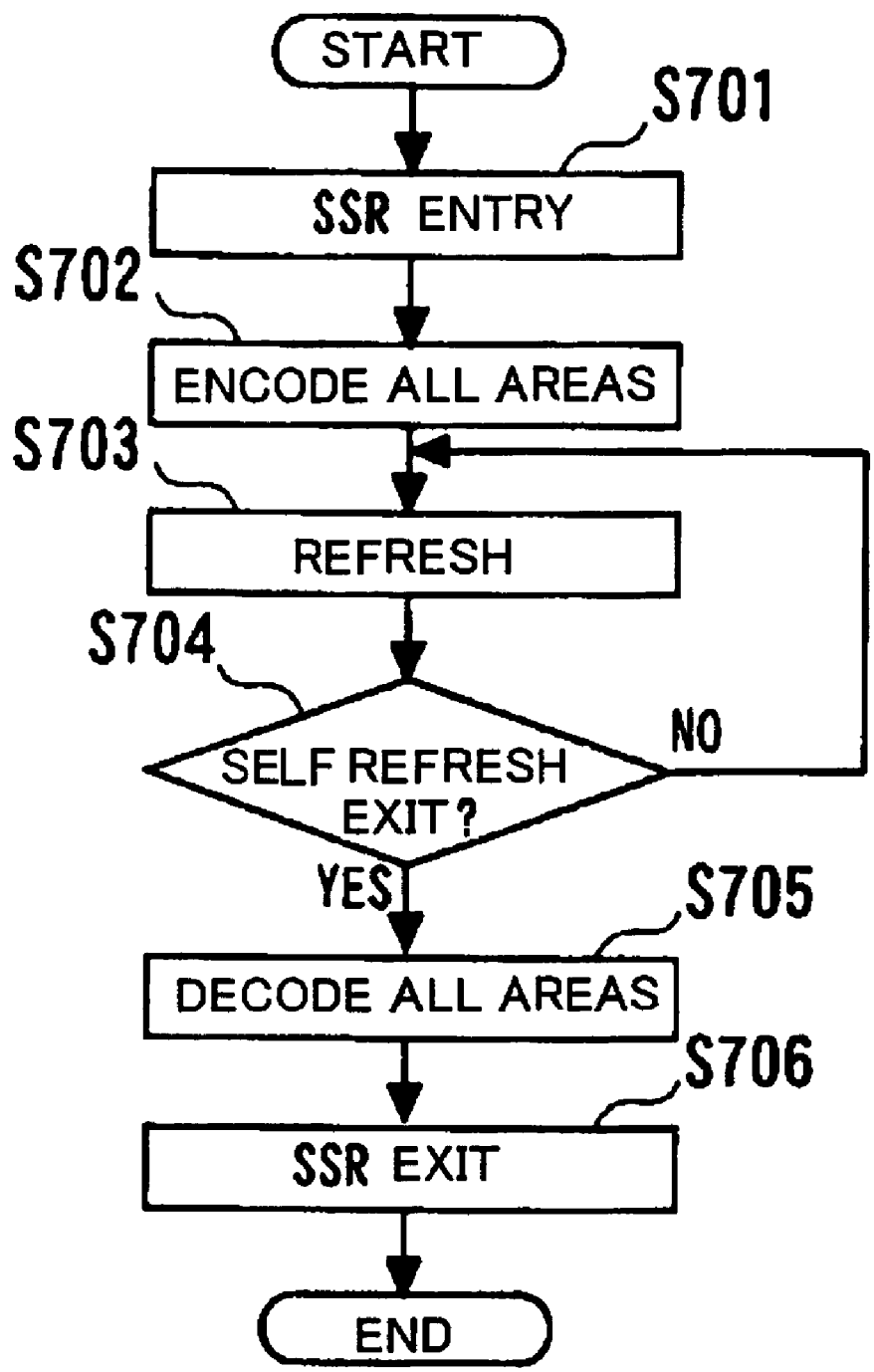
FIG. 23 is a flowchart for illustrating another example of the conventional refresh control.

FIGS. 21A and 21B illustrate the relationship between the current consumption and the transition of the inner state in the semiconductor storage device in the present embodiment. In FIGS. 21A and 21B, the second and the following self refresh operations as from power up sequence of the semiconductor storage device are shown. At the time of self refresh entry, the encoding of the cell data of the row address, accessed during the normal operation, is carried out, however, the selection of the refresh periods (initializing operation) is not carried out. As regards the first self refresh following power up sequence, the processing for selecting the refresh period (initializing processing) is inserted at the time of the self refresh entry, as mentioned previously. If, as shown in FIG. 21A, an error is detected during refresh with the long term T due e.g. to temperature rise during self refresh, the totality of the refresh periods are changed from T to T−ΔT for shortening the period. If conversely no error is detected during refresh with the long term T due e.g. to temperature decrease during self-refresh, as shown in FIG. 21B, the totality of the refresh periods is changed from T to T+ΔT by way of prolonging the period. In exiting from the self refresh, burst refresh of one bank of 8K words and error correction are carried out, as mentioned previously.

The semiconductor storage device, according to the present invention, is not limited to the clock synchronization DRAM, and may also be a non-synchronization DRAM, a hybrid memory LSI or to a pseudo-SRAM.

Although the present invention has so far been explained with reference to specified embodiments, it is noted that these embodiments are given only by way of illustration and the present invention may encompass various changes and corrections that may be envisaged by those skilled in the art without departing from the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
a memory array including a plurality of memory cells, arrayed at points of intersection between a plurality of bit lines and a plurality of word lines, said memory cells being in need of refresh for retention of data;
a storage circuit for storing a setting value of a refresh period, from among a plurality of preset refresh periods, which is associated with each word line; and
a circuit for managing control for inspecting data retention time in the memory cells, at the time of entry to a preset self refresh mode following a power up sequence, in terms of said word line as a unit, and for determining the setting value of the refresh period, in terms of said word line as a unit, based on the result of the inspection, to record the setting value thus determined in said storage circuit.

2. The semiconductor storage device according to claim 1, further comprising:
an encoding circuit for generating error correction codes for data of said memory cells to store the codes generated in a preset area of said memory array;
an error detection circuit for detecting an error of the data of said memory cell;
a decoding circuit for correcting the data of the memory cell where an error has been detected; and
a circuit for managing control for encoding, by said encoding circuit, data of the memory cells of the word line associated with the row address accessed during the operation in the normal mode prior to the time of the entry to said self refresh mode.

3. The semiconductor storage device according to claim 1, further comprising:
a storage circuit for recording the word line information associated with the row address accessed during the normal mode;
an encoding circuit for generating, at the time of entry to a preset self refresh mode following a power up sequence, prior to entry to said self refresh mode, check bit information for data of the memory cells connected to the word line associated with the row address accessed during the operation in the normal mode prior to the time of the entry to said self refresh mode, and for writing the so generated check bit information in a check bit area added to said memory array; and
a decoding circuit for correcting an error in the data of the memory cell where an error has been detected.

4. The semiconductor storage device according to claim 1, further comprising a self refresh control circuit including:
a circuit for generating a refresh address;
a circuit for generating a refresh period; and
a circuit for correcting a temperature characteristic of said refresh period.

5. The semiconductor storage device according to claim 3, wherein said check bit area added to said memory area is provided in a memory area accessed by said word line.

6. The semiconductor storage device according to claim 1, wherein said memory array includes at least one dummy cell for a plurality of memory cells for data storage connected to the same bit line, said dummy cell being connected to said same bit line;
wherein in setting the refresh period for each word-line, data retained in the memory cell connected to a word line being inspected as to data retention time is copied in said dummy cell; the memory cells connected to the word line being inspected as to whether or not an error is detected in the retention data in said memory cells, for a plurality of refresh periods, to select the refresh period for the word line being inspected; and
wherein control is managed so that, after determining the refresh period for said word line being inspected, the data copied in said dummy cells are restored to the memory cells in said word line being inspected.

7. The semiconductor storage device according to claim 6, wherein after activating the word line being inspected, and after amplifying the data retained by the memory cell connected to the word line being inspected by a sense amplifier connected to the bit line connected to the memory cell, the word line connected to said dummy cell is activated and the data amplified by said sense amplifier is restored in said dummy cell to copy the data in said dummy cell.

8. The semiconductor storage device according to claim 6, wherein the word line connected to said dummy cell is activated, the data retained by said dummy cell is amplified by a sense amplifier connected to the bit line connected to said dummy cell, the word line under inspection is then activated; and
wherein the data amplified by said sense amplifier is re-stored in the memory cell of the word line being inspected to restore the data of said dummy cell to the memory cell of the word line under inspection.

9. The semiconductor storage device according to claim 6, wherein, as data for error correction, a value which becomes a high level for a read-out value of a memory cell (Physical 1) is written in the memory cell connected to said word line the refresh period for which is being inspected.

10. The semiconductor storage device according to claim 1, wherein the selection of the word-line based refresh period is carried out as an initializing operation at the time of entry to the first self refresh mode following power up sequence.

11. The semiconductor storage device according to claim 1, wherein one bank includes a plurality of memory arrays and has a hierarchical word line configuration in which a sub-word line is provided every plural memory arrays for each main word line; and
wherein a storage circuit is provided which is selected for one main word line and which stores a refresh period for each of a plurality of sub-word lines associated with said one main word line.

12. The semiconductor storage device according to claim 11, further comprising
a decoding circuit which, when a main word line associated with a refresh address is selected, reads out the setting value of the refresh period from the storage circuit, configured for storing the refresh period for a plurality of sub-word lines associated with said main word line, to decode the refresh period;
wherein activation of a sub-word driver, provided for said plural memory arrays for driving said sub-word lines, is controlled based on the results of decoding by said decoding circuit.

13. The semiconductor storage device according to claim 1, further comprising:
a row decoder for decoding a row address to select a world line; and
a random-access storage circuit including a row decoder for decoding a row address to select a word line and also including a cell selected in association with the word line selected by said row decoder;
wherein the refresh period of each word line of said memory array is recorded in the word line selected by said row decoder.

14. The semiconductor storage device according to claim 1, wherein in exiting from said self refresh mode to said normal mode, said memory array is refreshed in a burst mode and an error in data of a cell detected is corrected and written.

15. A refresh control method for a semiconductor storage device including a memory array including a plurality of memory cells arrayed at points of intersection between a plurality of bit lines and a plurality of word lines, said memory cells being in need of refresh for retention of data, said method comprising the steps of;
inspecting data retention time in the memory cells, at the time of entry to a preset self refresh mode following power up sequence, in terms of said word line as a unit; and
determining the setting value of the refresh period of said word line, based on the results of inspection, to record the setting value thus determined in said storage circuit in a storage circuit; with the refresh period being selected every word line.

16. The refresh control method for a semiconductor storage device according to claim 15, comprising the steps of:
storing a word line associated with the row address accessed during the normal mode; and
reading out data of the memory cells connected to the word line associated with the row address accessed during the operation in the normal mode at the time of entry from the normal mode to the self refresh mode prior to the time of self refresh, generating check bit information for said data and for writing the so generated check bit information in a check bit area added to said memory array.

17. The refresh control method for a semiconductor storage device according to claim 15, further comprising the steps of:
detecting, by an error detection circuit, whether or not there is any error in said self refresh in said retention data of said memory cells;
correcting the memory cell data, detected to be in error, by an error correction circuit; and
changing the setting value of the refresh period of the word line connected to the memory cell where an error has been detected, and recording the setting value thus changed in said storage circuit in association with said word line.

18. The refresh controlling method according to claim 17, further comprising a step of
managing control for changing the setting value of the refresh period for said word line connected to the memory cell where an error has been detected and for recording the setting value thus changed in said storage circuit in association with said word line.

19. The refresh controlling method according to 15, further comprising a step of
variably controlling the length of said refresh period with a preset proportion based on the result of error correction in a refresh operation with a preset refresh period.

20. The refresh controlling method according to claim 19, further comprising a step of
managing control for shortening the refresh period of the refresh operation with a preset proportion in case an error has been detected.

21. The refresh controlling method according to claim 19, further comprising a step of
managing control for lengthening the refresh period of the refresh operation with a preset proportion in case no error has been detected.

22. The refresh controlling method according to claim 16, wherein said check bit area is provided in a memory area accessed by said word line.

23. The refresh controlling method according to claim 15, further comprising the steps of:
providing, in said memory array, at least one dummy cell connected to a plurality of memory cells for data storage, connected to the same bit line, said dummy cell being connected to the same bit line, and copying, in setting the word-line based refresh period, the retention data of the memory cells, connected to a word line being inspected as to the refresh period, in said dummy cell;
inspecting the word line under inspection, as to whether or not an error is detected in a memory cell in connection with preset plural refresh periods, for selecting the refresh period of the word line under inspection; and
connecting the data, copied in said dummy cell, to the memory cell connected to the word line being inspected, after the end of the setting of the refresh period of the word line under inspection.

24. The refresh controlling method according to claim 23, further comprising the steps of:
activating a word line being inspected and amplifying retention data of a memory cell connected to said word line being inspected by a sense amplifier connected to a bit line connected to said memory cell; and
then activating the word line connected to said dummy cell to restore the data amplified by said sense amplifier in said dummy cell;
wherein the retention data of the memory cell connected to said word line being inspected is copied in said dummy cell.

25. The refresh controlling method according to claim 23, further comprising steps of:
activating a word line connected to said dummy cell and amplifying the retention data of said dummy cell by a sense amplifier connected to the bit line connected in turn to said dummy cell; and
then activating the word line under inspection to restore the data amplified by said sense amplifier in the memory cell of the word line under inspection;
wherein the data of said dummy cell is restored to the memory cell of the word line under inspection.

26. The refresh controlling method according to claim 15, further comprising the steps of
writing, as data for error detection for selecting said refresh period, a value which becomes a high level for a read-out value of a memory cell (Physical 1) in a memory cell; and
detecting, after lapse of the refresh period, whether or not there is any error in the data of said memory cell connected to the word line associated with the refresh address, for selecting the refresh period.

27. The refresh controlling method according to claim 15, wherein the selection of the word-line based refresh period is carried out at the time of initializing the entry to the first self refresh mode following power up sequence.

28. The refresh controlling method according to claim 17, wherein a one-bit error is detected every plural bit lines by an error detector provided in said memory array and the results detected are notified to said error detection circuit.

29. The refresh controlling method according to claim 15, wherein one bank includes a plurality of memory arrays and has a hierarchical word line configuration in which a sub-word line is provided for one main word line every plural memory arrays; and wherein the method further comprises a step of recording the information as to whether or not a row address has been accessed in said storage circuit every main word line.

30. The refresh controlling method according to claim 15, wherein one bank includes a plurality of memory arrays and has a hierarchical word line configuration in which a sub-word line is provided for each main word line every plural memory arrays; wherein the method further comprises a step of storing the refresh period in a storage circuit for each of a plurality of sub-word lines, selected in association with a main word line, and associated with said main word line; and wherein the refresh period may be variably set for each of a plurality of sub-word lines associated with said main word line.

31. The refresh controlling method according to claim 17, wherein one bank includes a plurality of memory arrays and has a hierarchical word line configuration in which a sub-word line is provided for each main word line every plural memory arrays; and wherein the method comprises a step of said error detector updating, in case an error has been detected in a refresh period during refresh period inspection pertinent to a sub-word line, said refresh period to a shorter refresh period, and updating a setting value of a storage circuit storing the refresh period of said sub-word line.

32. The refresh controlling method according to claim 16, wherein a random-access storage circuit including a cell selected in association with a word line selected by a row decoder decoding a row address to select a word line is provided; and wherein the information as to whether or not the row address has been accessed is written in and read out from a cell selected by a word line as selected by said row decoder.

33. The refresh controlling method according to claim 15, wherein a random-access storage circuit including a cell selected in association with a word line selected by a row decoder decoding a row address to select a word line is provided; and wherein the refresh period of each word line of said memory array is recorded in the cells selected by a word line selected by said row decoder.

34. The refresh controlling method according to claim 15, wherein said memory array has a hierarchical word line configuration in which a sub-word line is provided for each word line every plural arrays; and wherein the refresh period of said sub-word line is recorded in a storage circuit for the same main word line.

35. A refresh controlling method for a semiconductor storage device including a memory array including a plurality of memory cells, arrayed at points of intersection between a plurality of bit lines and a plurality of word lines, said memory cells being in need of refresh for retention of data, said method comprising the steps of:

storing, in a storage circuit, information as to the word line associated with a row address accessed during the operation in the normal mode;

managing control for reading out data of a memory cell connected to a word line associated with the row address accessed during the operating period with said normal mode at the time of entry from said normal mode prior to said self refresh, and generating check bit information for said data to write the check bit information in an check bit area provided in said memory cell array; and inspecting the data retention time in the memory cells, as an initializing processing to an entry to a self refresh mode following power up sequence, every word line, determining a setting value of the refresh period of said word line based on the results of inspection and writing the setting value in a storage circuit to select the refresh period every word line.

36. The refresh controlling method according to claim 35, wherein said memory array includes at least one dummy cell for a plurality of memory cells for data storage connected to the same bit line, said dummy cell being connected to said same bit line; said method comprising the steps of:

copying data of a memory cell, connected to a word line, as a subject of refresh period inspection, in said dummy cell, in selecting the word-line based refresh period;

inspecting whether or not an error is detected in a memory cell for said word line, with a plurality of preset refresh periods, to select the refresh periods; and restoring, after end of the setting of the refresh period on said word line, the data copied in said dummy cell to said memory cell.

37. The refresh controlling method for a semiconductor storage device as claimed in claim 35, wherein, in case an error has been detected in a memory cell by said refresh, such error is corrected and the refresh period of said word line is set to a refresh period shorter than said one refresh period.

38. The refresh controlling method for a semiconductor storage device according to claim 15, further comprising a step of refreshing said memory array in a burst mode, correcting an error in data of a cell detected, and writing the corrected data in exiting from said self refresh mode to said normal mode.

* * * * *